United States Patent
Allen et al.

(10) Patent No.: US 10,763,090 B2
(45) Date of Patent: *Sep. 1, 2020

(54) HIGH PRESSURE RF-DC SPUTTERING AND METHODS TO IMPROVE FILM UNIFORMITY AND STEP-COVERAGE OF THIS PROCESS

(71) Applicant: Applied Materials, Inc., Santa Clara, CA (US)

(72) Inventors: Adolph Miller Allen, Oakland, CA (US); Lara Hawrylchak, Gilroy, CA (US); Zhigang Xie, San Jose, CA (US); Muhammad M. Rasheed, San Jose, CA (US); Rongjun Wang, Dublin, CA (US); Xianmin Tang, San Jose, CA (US); Zhendong Liu, Tracy, CA (US); Tza-Jing Gung, San Jose, CA (US); Srinivas Gandikota, Santa Clara, CA (US); Mei Chang, Saratoga, CA (US); Michael S. Cox, Gilroy, CA (US); Donny Young, Cupertino, CA (US); Kirankumar Savandaiah, Bangalore (IN); Zhenbin Ge, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 421 days.

This patent is subject to a terminal disclaimer.

(21) Appl. No.: 15/237,414

(22) Filed: Aug. 15, 2016

(65) Prior Publication Data

US 2017/0029941 A1    Feb. 2, 2017

Related U.S. Application Data

(63) Continuation of application No. 12/754,473, filed on Apr. 5, 2010, now abandoned.
(Continued)

(51) Int. Cl.
*H01J 37/34* (2006.01)
*C23C 14/34* (2006.01)
(Continued)

(52) U.S. Cl.
CPC ........ *H01J 37/3411* (2013.01); *C23C 14/345* (2013.01); *C23C 14/3492* (2013.01);
(Continued)

(58) Field of Classification Search
CPC .. H01J 37/345; H01J 37/3452; H01J 37/3408; H01J 37/3441; H01J 37/3455;
(Continued)

(56) References Cited

U.S. PATENT DOCUMENTS

| 4,731,172 A | 3/1988 | Adachi et al. |
| 5,180,476 A * | 1/1993 | Ishibashi ............... C23C 14/086 |
| | | 204/192.29 |

(Continued)

FOREIGN PATENT DOCUMENTS

| EP | 0634782 A1 | 1/1995 |
| KR | 10-0659828 | 12/2006 |

(Continued)

OTHER PUBLICATIONS

Nishimiya, T.; Takeuchi, Y.; Yamauchi, Y.; Takatsuka, H.; Shioya, T.; Muta, H.; Kawai, Y. Large area VHF plasma production by a balanced power feeding method. Thin Solid Films, vol. 516, Issue 13, May 2008, p. 4430-4434. [Accessed on Jan. 20, 2019] (Year: 2008).*

(Continued)

*Primary Examiner* — Michael A Band
(74) *Attorney, Agent, or Firm* — Patterson + Sheridan LLP

(57) ABSTRACT

Embodiments of the invention generally provide a processing chamber used to perform a physical vapor deposition
(Continued)

(PVD) process and methods of depositing multi-compositional films. The processing chamber may include: an improved RF feed configuration to reduce any standing wave effects; an improved magnetron design to enhance RF plasma uniformity, deposited film composition and thickness uniformity; an improved substrate biasing configuration to improve process control; and an improved process kit design to improve RF field uniformity near the critical surfaces of the substrate. The method includes forming a plasma in a processing region of a chamber using an RF supply coupled to a multi-compositional target, translating a magnetron relative to the multi-compositional target, wherein the magnetron is positioned in a first position relative to a center point of the multi-compositional target while the magnetron is translating and the plasma is formed, and depositing a multi-compositional film on a substrate in the chamber.

19 Claims, 16 Drawing Sheets

Related U.S. Application Data

(60) Provisional application No. 61/166,682, filed on Apr. 3, 2009, provisional application No. 61/319,377, filed on Mar. 31, 2010.

(51) Int. Cl.

| | | |
|---|---|---|
| C23C 14/35 | (2006.01) | |
| C23C 14/54 | (2006.01) | |
| C23C 14/56 | (2006.01) | |
| H01J 37/32 | (2006.01) | |

(52) U.S. Cl.
CPC ............ *C23C 14/35* (2013.01); *C23C 14/564* (2013.01); *H01J 37/32642* (2013.01); *H01J 37/3405* (2013.01); *H01J 37/345* (2013.01); *H01J 37/3408* (2013.01); *H01J 37/3441* (2013.01); *H01J 37/3452* (2013.01); *H01J 37/3455* (2013.01)

(58) Field of Classification Search
CPC ............ H01J 37/32642; H01J 37/3411; C23C 14/345; C23C 14/35; C23C 14/548; C23C 14/564; C23C 14/3492; C23C 14/358
See application file for complete search history.

(56) References Cited

U.S. PATENT DOCUMENTS

| | | | |
|---|---|---|---|
| 5,293,126 A | 3/1994 | Schaefer | |
| 5,507,499 A | 4/1996 | Davenport et al. | |
| 5,540,821 A | 7/1996 | Tepman | |
| 6,039,580 A | 3/2000 | Sciarretta et al. | |
| 6,117,279 A | 9/2000 | Smolanoff et al. | |
| 6,296,747 B1 | 10/2001 | Tanaka | |
| 6,440,282 B1 | 8/2002 | Wada et al. | |
| 7,041,200 B2 | 5/2006 | Le et al. | |
| 7,041,201 B2 | 5/2006 | Gung et al. | |
| 7,179,351 B1* | 2/2007 | Juliano ................. C23C 14/35 204/192.12 |
| 7,208,878 B2 | 4/2007 | Shin et al. | |
| 7,952,352 B2 | 5/2011 | Ogawa et al. | |
| 8,070,925 B2* | 12/2011 | Hoffman ................. C23C 14/35 204/298.08 |
| 8,486,242 B2* | 7/2013 | Cox ................. C23C 14/34 118/723 E |
| 8,795,488 B2* | 8/2014 | Rasheed ............... H01J 37/3411 204/298.02 |
| 2003/0052001 A1 | 3/2003 | Park et al. | |
| 2005/0211548 A1 | 9/2005 | Gung et al. | |
| 2006/0076232 A1 | 4/2006 | Miller et al. | |
| 2006/0169582 A1* | 8/2006 | Brown ................. C23C 14/046 204/298.01 |
| 2007/0283884 A1* | 12/2007 | Tiller .................... C23C 14/564 118/715 |
| 2008/0023318 A1 | 1/2008 | Kuroiwa | |
| 2008/0099329 A1 | 5/2008 | Pavloff et al. | |
| 2010/0012480 A1 | 1/2010 | Forster et al. | |
| 2010/0104771 A1 | 4/2010 | Kudela et al. | |

FOREIGN PATENT DOCUMENTS

| | | |
|---|---|---|
| KR | 10-2007-0017362 | 2/2007 |
| KR | 10-2007-0097298 | 10/2007 |
| KR | 10-2007-0115564 | 12/2007 |
| WO | 00/30147 A1 | 5/2000 |
| WO | 03/090248 A2 | 10/2003 |

OTHER PUBLICATIONS

Korean Office Action (with attached English translation) for Application No. 10-2011-7026049; dated Oct. 31, 2016; 6 total pages.
Vossen, et al.; Thin Film Processes; RCA Laboratories; David Sarnoff Research Center; dated 1978; pp. 11-92.
Swann; Film Thickness Distribution in Magnetron Sputtering; vol. 38/Nos. 8-10/pp. 791-794; dated 1988.
Vossen, et al.; Thin Film Processes II; RCA Laboratories; David Sarnoff Research Center; dated 1991; pp. 11-17, 24-33 and 177-209.
Donald M. Mattox; Vacuum Deposition, Reactive Evaporation, and Gas Evaporation; ASH Handbook vol. 5; Surface Engineering (ASM International); dated 1994; pp. 556-572.
International Search Report and Written Opinion of PCT/US2010/029815, dated Oct. 29, 2010.
Official Letter dated Dec. 4, 2013, from China Patent Office for corresponding China Patent Application No. 201080022533X.
Taiwanese Office Action (with attached English translation) for Application No. 099110606 dated Dec. 5, 2014; 13 total pages.
Korean Office Action (with attached English translation) for Application No. 10-2011-7026049; dated Apr. 20, 2016; 15 total pages.
Korean Office Action (with attached English translation) for Application No. 10-2017-7008151; dated Jul. 17, 2017; 11 total pages.

* cited by examiner

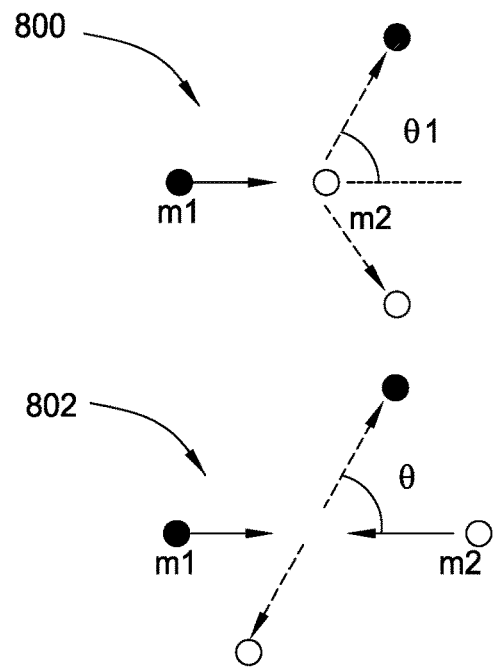
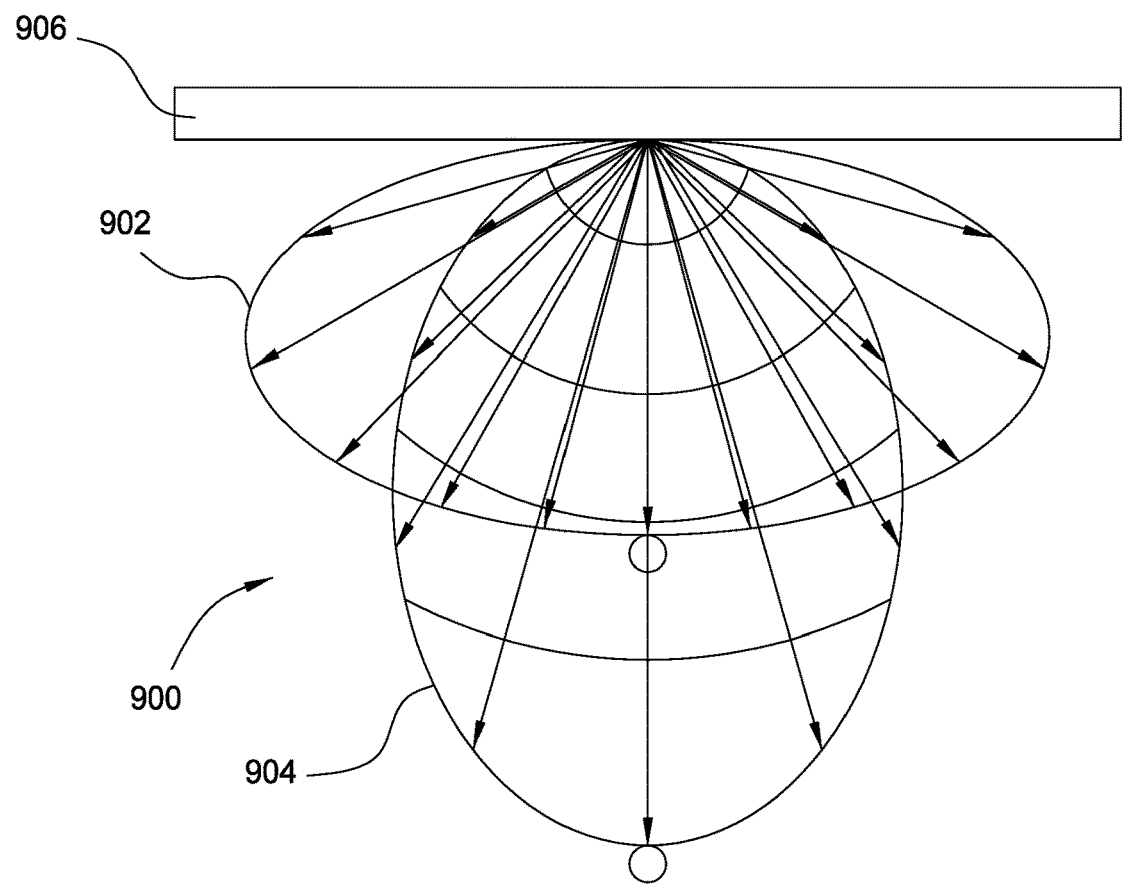
FIG. 8
FIG. 9

HIGH PRESSURE RF-DC SPUTTERING AND METHODS TO IMPROVE FILM UNIFORMITY AND STEP-COVERAGE OF THIS PROCESS

CROSS-REFERENCE TO RELATED APPLICATIONS

This application is a continuation application of co-pending U.S. patent application Ser. No. 12/754,473, filed on Apr. 5, 2010, which claims benefit of U.S. Provisional Patent Application Ser. No. 61/166,682, filed Apr. 3, 2009, and U.S. Provisional Patent Application Ser. No. 61/319,377, filed Mar. 31, 2010, which are incorporated herein by reference.

BACKGROUND OF THE INVENTION

Embodiments of the present invention generally relate to methods and an apparatus of forming metal and dielectric layers. More particularly, embodiments of the invention relate to methods and an apparatus for forming a metal gate and associated dielectric layers.

DESCRIPTION OF THE RELATED ART

Integrated circuits may include more than one million micro-electronic devices such as transistors, capacitors, and resistors. One type of integrated circuit are field effect transistors (e.g., complementary metal-oxide-semiconductor (CMOS) field effect transistors) that are formed on a substrate (e.g., semiconductor substrate) and cooperate to perform various functions within the circuit. A CMOS transistor comprises a gate structure disposed between source and drain regions that are formed in the substrate. The gate structure generally comprises a gate electrode and a gate dielectric. The gate electrode is disposed over the gate dielectric to control a flow of charge carriers in a channel region formed between the drain and source regions beneath the gate dielectric. To increase the speed of the transistor, the gate dielectric may be formed from a material having a dielectric constant greater than 4.0. Herein such dielectric materials are referred to as high-k materials.

The gate dielectric layer may be formed of dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate (Pb($ZrTi)O_3$, or PZT), and the like. It should be noted, however, that the film stack may comprise layers formed of other materials.

Gate stacks may also incorporate metal layers formed on the high-k dielectric instead of conventional polysilicon. The metal layers may include TiN, TiAl, WN, HfC, HfN, silicides for FUSI or fully silicided metal gates.

Further, a high mobility interface layer may be deposited in the gate structure between the substrate and the high-k dielectric layer. Various methods may be used to form CMOS high-k/metal gate stack structures such as a replacement gate approach, a gate first approach, and a gate last approach.

Fabrication of gate structures of field effect transistors having the high-k gate dielectric/gate last approach comprises a series of processing steps (e.g., depositing multiple layers). In a gate stack structure forming process, not only conformal films are required, but also the good qualities of the interfacial layers between each layer are essential.

In conventional CMOS fabrication schemes, the substrate is required to pass between tools having the various reactors coupled thereto. The process of passing the substrate between tools necessitates the removal of the substrate from the vacuum environment of one tool for transfer at ambient pressures to the vacuum environment of a second tool. In the ambient environment, the substrates are exposed to mechanical and chemical contaminants, such as particles, moisture, and the like, that may damage the gate structures being fabricated and possibly form an undesired interfacial layer, e.g., native oxide, between each layer while transferring. As gate structures become smaller and/or thinner to increase the device speed, the detrimental effect of forming interfacial layers or contamination becomes an increased concern. Additionally, the time spent on transferring the substrate between the cluster tools decreases productivity in manufacture of the field effect transistors.

Additionally, fabrication processes for gate stack structures may include a chemical vapor deposition (CVD) process to form the metal layers. However, residual particles from organo-metallic precursors may contaminate the underlying dielectric layers when forming the metal portion of the gate stack, adversely affecting the dielectric properties of the gate dielectric layer. Furthermore, as transistor sizes decrease below 45 nm and have higher aspect ratios, achieving sufficient film uniformity and step-coverage becomes increasingly difficult.

Therefore, there is a need in the art for methods and an apparatus for forming a gate stack that has improved properties.

SUMMARY OF THE INVENTION

In one embodiment of the invention, a high pressure RF DC PVD chamber is disclosed having a dual ring magnetron comprising asymmetric magnet rings, a low profile cover ring and deposition ring, and a pedestal capacitive tuner.

In another embodiment of the invention, a method for depositing a metal film is disclosed. The method includes flowing a high pressure gas into a chamber, igniting a plasma from the gas using an RF and DC power source electrically connected to a sputtering target, forming a dense plasma by using a magnetron, tuning a pedestal to match the RF power source, and depositing a metal film on a substrate in the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 illustrates elastic collisions of particles during a sputtering process.

FIG. 9 illustrates the sputtering distribution of a multi-component target in a sputtering chamber.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally provide a processing chamber used to perform a physical vapor deposition (PVD) process. In one embodiment, the process chamber design is adapted to deposit a desired material using an RF physical vapor deposition (PVD) process. The processing chamber disclosed herein may be especially useful for depositing multi-compositional films. The processing chamber's design features may include: an improved RF feed configuration to reduce any standing wave effects; an improved magnetron design to enhance RF plasma uniformity, deposited film composition and thickness uniformity; an improved substrate biasing configuration to improve process control; and an improved process kit design to improve RF field uniformity near the critical surfaces of the substrate to promote greater process uniformity and repeatability.

Figure 1A:
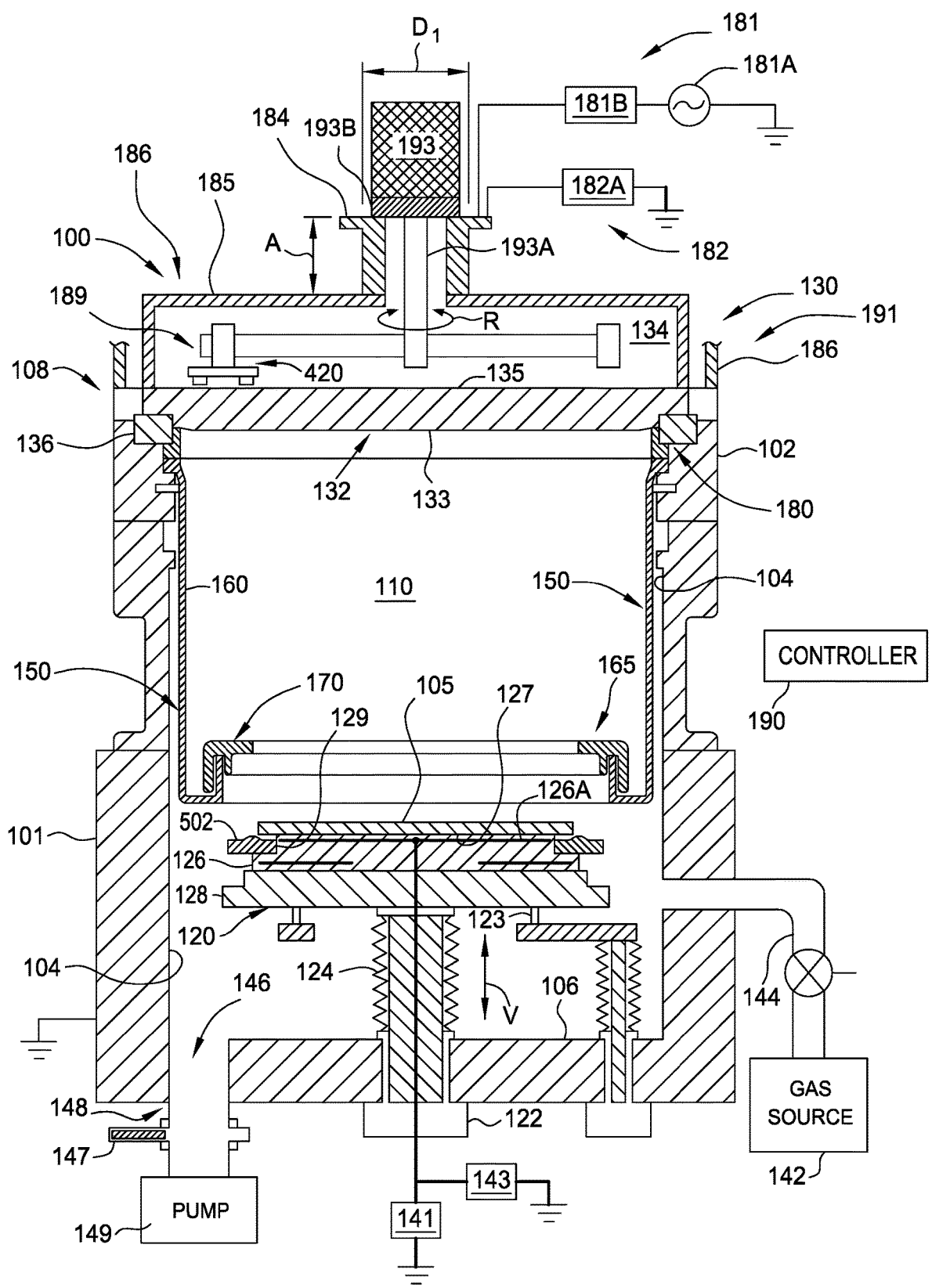
FIG. 1A is a cross-sectional view of a chamber according to one embodiment of the invention.

FIG. 1A illustrates an exemplary semiconductor processing chamber 100 having an upper process assembly 108, a process kit 150 and a pedestal assembly 120, which are all configured to process a substrate 105 disposed in a processing region 110. The process kit 150 includes a one-piece grounded shield 160, a lower process kit 165, and an isolator ring assembly 180. In the version shown, the processing chamber 100 comprises a sputtering chamber, also called a physical vapor deposition or PVD chamber, capable of depositing a single or multi-compositional material from a target 132 on the substrate 105. The processing chamber 100 may also be used to deposit aluminum, copper, nickel, platinum, hafnium, silver, chrome, gold, molybdenum, silicon, ruthenium, tantalum, tantalum nitride, tantalum carbide, titanium nitride, tungsten, tungsten nitride, lanthanum, alumina, lanthanum oxides, nickel platinum alloys, and titanium, and or combination thereof. Such processing chambers are available from Applied Materials located in Santa Clara, Calif. It is contemplated that other processing chambers including those from other manufacturers may be adapted to benefit from one or more of the embodiments of the invention described herein.

The processing chamber 100 includes a chamber body 101 having sidewalls 104, a bottom wall 106, and an upper process assembly 108 that enclose a processing region 110 or plasma zone. The chamber body 101 is typically fabricated from welded plates of stainless steel or a unitary block of aluminum. In one embodiment, the sidewalls comprise aluminum and the bottom wall comprises stainless steel plate. The sidewalls 104 generally contain a slit valve (not shown) to provide for entry and egress of a substrate 105 from the processing chamber 100. Components in the upper process assembly 108 of the processing chamber 100 in cooperation with the grounded shield 160, pedestal assembly 120 and cover ring 170 confine the plasma formed in the processing region 110 to the region above the substrate 105.

A pedestal assembly 120 is supported from the bottom wall 106 of the chamber 100. The pedestal assembly 120 supports a deposition ring 502 along with the substrate 105 during processing. The pedestal assembly 120 is coupled to the bottom wall 106 of the chamber 100 by a lift mechanism 122, which is configured to move the pedestal assembly 120 between an upper processing position and lower transfer position. Additionally, in the lower transfer position, lift pins 123 are moved through the pedestal assembly 120 to position the substrate a distance from the pedestal assembly 120 to facilitate the exchange of the substrate with a substrate transfer mechanism disposed exterior to the processing chamber 100, such as a single blade robot (not shown). A bellows 124 is typically disposed between the pedestal assembly 120 and the chamber bottom wall 106 to isolate the processing region 110 from the interior of the pedestal assembly 120 and the exterior of the chamber.

The pedestal assembly 120 generally includes a support 126 sealingly coupled to a platform housing 128. The platform housing 128 is typically fabricated from a metallic material such as stainless steel or aluminum. A cooling plate (not shown) is generally disposed within the platform housing 128 to thermally regulate the support 126. One pedestal assembly 120 that may be adapted to benefit from the embodiments described herein is described in U.S. Pat. No. 5,507,499, issued Apr. 16, 1996 to Davenport et al. which is incorporated herein by reference in its entirety.

The support 126 may be comprised of aluminum or ceramic. The substrate support 126 has a substrate receiving surface 127 that receives and supports the substrate 105 during processing, the substrate receiving surface 127 being substantially parallel to a sputtering surface 133 of the target 132. The support 126 also has a peripheral edge 129 that terminates before an overhanging edge 105A of the substrate 105. The support 126 may be an electrostatic chuck, a ceramic body, a heater or a combination thereof. In one embodiment, the support 126 is an electrostatic chuck that includes a dielectric body having a conductive layer, or electrode 126A, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 120 and support 126 are further described below. In one embodiment, the conductive layer 126A is configured so that when a DC voltage is applied to the conductive layer 126A, by an electrostatic chuck power supply 143, a substrate 105 disposed on the substrate receiving surface 127 will be electrostatically chucked thereto to improve the heat transfer between the substrate 105 and the support 126. In another embodiment, an impedance controller 141 is also coupled to the conductive layer 126A so that a voltage can be maintained on the substrate during processing to affect the plasma interaction with the surface of the substrate 105.

The chamber 100 is controlled by a system controller 190 that is generally designed to facilitate the control and automation of the processing chamber 100 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 190 determines which tasks are performable on a substrate. Preferably, the program is software readable by the system controller 190 that includes code to perform tasks relating to monitoring, execution and control of the movement and various process recipe tasks and recipe steps being performed in the processing chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve or gate valve to maintain a pressure in the chamber 100; a temperature control instruction set to control a temperature control system (not shown) in the pedestal assembly 120 or sidewalls 104 to set temperatures of the substrate or sidewalls 104, respectively; and a process monitoring instruction set to monitor the process in the chamber 100.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises an isolator ring assembly 180, a grounded shield 160 and a ring assembly 168 for placement about a peripheral edge 129 of the support 126 that terminates before an overhanging edge of the substrate 105.

Figure 1B:
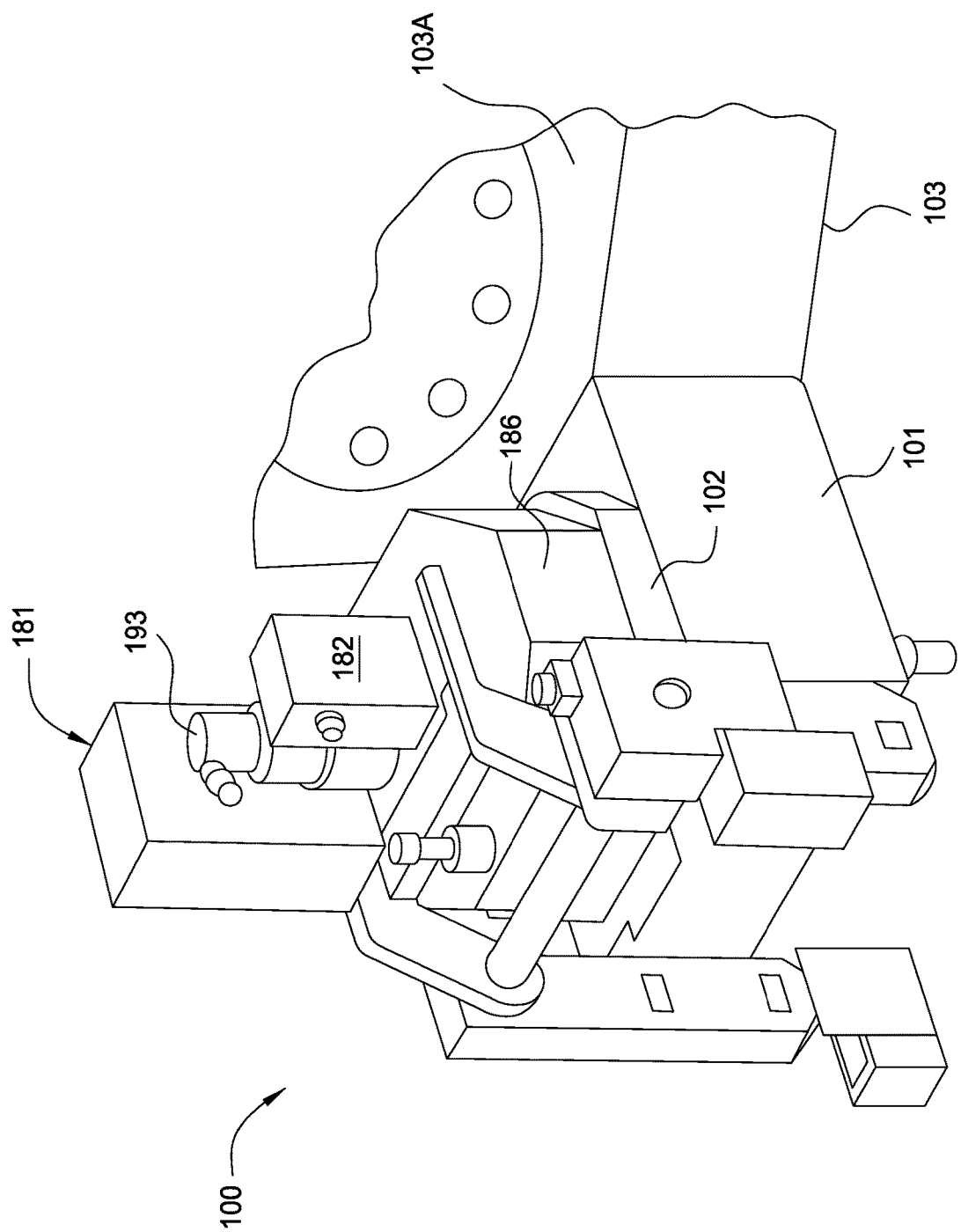
FIG. 1B depicts an isometric view of a chamber according to one embodiment of the invention.

FIG. 1B is an isometric view of the processing chamber 100 that is coupled to a processing position of a cluster tool 103. The cluster tool 103 may also contain other processing chambers (not shown) that are adapted to perform one or more processing steps on a substrate prior to or after performing the deposition process in the processing chamber 100. An exemplary cluster tool 103 may include a Centura™ or an Endura™ systems available from Applied Materials, Santa Clara, Calif. The cluster tool 103 may include one or more load-lock chambers (not shown), one or more process chambers, and a cool-down chamber (not shown), all of which are attached to a central transfer chamber 103A. In one example, the cluster tool 103 may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes. A transfer tool, for example, a robot (not shown) disposed in the transfer chamber 103A, may be used to transfer substrates to and from one or more chambers attached to the cluster tool 103.

Figure 2:
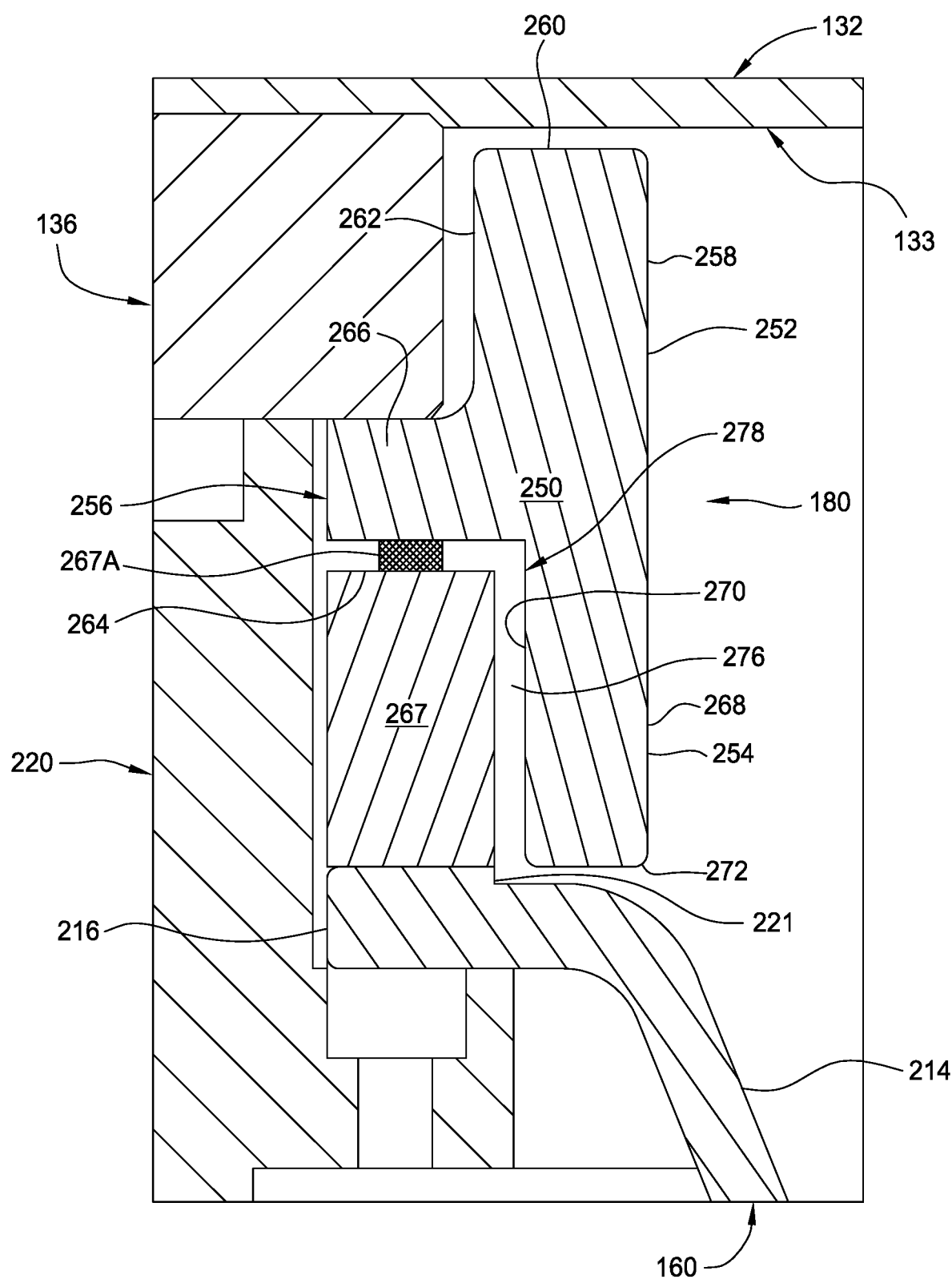
FIG. 2 is a close-up cross-sectional view of a portion of the chamber illustrated in FIG. 1A according to one embodiment of the invention.

With reference to FIGS. 1A and 2, in one embodiment, the process chamber 100 includes an isolator ring assembly 180 that includes an isolator ring 250 and support ring 267 that are disposed adjacent to the target 132, the edge 216 of the grounded shield 160 and target isolator 136. The isolator ring 250 extends about and surrounds the outer edge of the sputtering surface 133 of the target 132. The isolator ring 250 of the isolator ring assembly 180 comprises a top wall 252, a bottom wall 254, and a support rim 256 that extends radially outward from the top wall 252 of the isolator ring 250. An example of an exemplary isolator ring design is further described in the commonly assigned U.S. patent application Ser. No. 12/433,315, which is herein incorporated by reference.

The top wall 252 comprises an inner periphery 258, a top surface 260 positioned adjacent to the target 132, and an outer periphery 262 positioned adjacent to the target isolator 136. The support rim 256 comprises a bottom contact surface 264 and an upper surface 266. The bottom contact surface 264 of the support rim 256 is supported by a spring member 267A (e.g., compressible metal spring element) that is coupled to the support ring 267 to bias the isolator ring towards and against the surface of the target isolator 136. The use of the spring member 267A can help reduce the tolerance stack-up between the isolator ring 250, and its supporting components, and the sputtering surface 133 so that a desirable gap can be reliably maintained between the top surface 260 of the isolator ring 250 and the sputtering surface 133. The gap formed between the top surface 260 and the sputtering surface 133 is important to prevent the plasma formed in the processing region 110 from extending into the gap, and causing sealing and/or particle problems to occur. The bottom wall 254 comprises an inner periphery 268, an outer periphery 270, and a bottom surface 272. The inner periphery 268 of the bottom wall 254 and the inner periphery 258 of the top wall 252 form a unitary surface.

A vertical trench 276 is formed at a transition point 278 between the outer periphery 270 of the bottom wall 254 and the bottom contact surface 264 of the support rim 256. The step 221 of the shield 160 in combination with the vertical trench 276 provides a labyrinth gap that prevents conductive material from creating a surface bridge between the isolator ring assembly 180 and the shield 160, thus maintaining electrical discontinuity while still providing shielding to the chamber walls 104, 106. In one embodiment, the isolator ring assembly 180 provides a gap between the target 132 and the ground components of the process kit 150 while still providing shielding to the chamber walls. The stepped design of the isolator ring assembly 180 allows for the shield 160 to be centered with respect to the adapter 220, which is also the mounting point for the mating shields and the alignment features for the target 132. The stepped design also eliminates line-of-site deposition from the target 132 to the support ring 267, eliminating arcing concerns in this area.

In one embodiment, the isolator ring assembly 180 has a grit-blasted surface texture or arc sprayed aluminum film deposited thereon to achieve a surface roughness (Ra value) of at least 180±20 microinches (0.0041-0.0051 mm) to enhance film adherence. The support rim 256 allows for the isolator ring assembly 180 to be centered with respect to the adapter 220 while eliminating the line-of-site from the target 132 to the grounded shield 160 thus eliminating stray plasma concerns. In one embodiment the support ring 267 comprises a series of alignment pins (not shown) that locate/align with a series of slots (not shown) in the shield 160.

The inner surface 214 of the shield 160 generally encircles the sputtering surface 133 of a sputtering target 132 that faces the support 126 and the peripheral edge 129 of the support 126. The shield 160 covers and shadows the sidewalls 104 of the chamber 100 to reduce deposition of sputtering deposits originating from the sputtering surface 133 of the sputtering target 132 onto the components and surfaces behind the shield 160. For example, the shield 160 can protect the surfaces of the support 126, the overhanging edge of the substrate 105, sidewalls 104 and bottom wall 106 of the chamber 100.

Lid Assembly Region

The upper process assembly 108 may also comprise an RF source 181, a direct current (DC) source 182, an adaptor 102, a motor 193, and a lid assembly 130. The lid assembly 130 generally comprises a target 132, a magnetron system 189 and a lid enclosure 191. The upper process assembly 108 is supported by the sidewalls 104 when in a closed position, as shown in FIGS. 1A and 1B. A ceramic target isolator 136 is disposed between the isolator ring assembly 180, the target 132 and adaptor 102 of the lid assembly 130 to prevent vacuum leakage therebetween. The adaptor 102 is sealably coupled to the sidewalls 104, and is configured to help with the removal of the upper process assembly 108 and isolator ring assembly 180.

When in the processing position, the target 132 is disposed adjacent to the adaptor 102, and is exposed to the processing region 110 of the processing chamber 100. The target 132 contains material that is deposited on the substrate 105 during a PVD, or sputtering, process. The isolator ring assembly 180 is disposed between the target 132 and the shield 160 and chamber body 101 to electrically isolate the target 132 from the shield 160 and chamber body 101.

During processing, the target 132 is biased relative to a grounded region of the processing chamber (e.g., chamber body 101 and adaptor 102) by a power source disposed in the RF source 181 and/or the direct current (DC) source 182. It is believed that by delivering RF energy and DC power to the target 132 during a high pressure PVD process, significant process advantages can be achieved over conventional low pressure DC plasma processing techniques when used in conjunction with sputtering a multi-compositional film, such as sputtering titanium and aluminum, or titanium and tungsten to name just a few. Additionally, in one embodiment, the combination of RF and DC power sources allows for a lower overall RF power to be used during processing versus a RF only source, which can help to decrease plasma related damage of the substrate and increase device yield. In one embodiment, the RF source 181 comprises an RF power source 181A and an RF match 181B that are configured to efficiently deliver RF energy to the target 132. In one example, the RF power source 181A is capable of generating RF currents at a frequency of between about 13.56 MHz and about 128 MHz at powers between about 0 and about 5 kWatts. In one example, the DC power supply 182A in the DC source 182 is capable of delivering between about 0 and about 10 kWatts of DC power. In another example, the RF power source 181A is capable of generating an RF power density of between about 0 and about 33 kWatts/m$^2$ at the target and the DC source 182 is capable of delivering a power density of between about 0 and about 66 kWatts/m$^2$.

During processing, a gas, such as argon, is supplied to the processing region 110 from a gas source 142 via conduits 144. The gas source 142 may comprise a non-reactive gas such as argon, krypton, helium or xenon, which is capable of energetically impinging upon and sputtering material from the target 132. The gas source 142 may also include a reactive gas, such as one or more of an oxygen-containing gas or a nitrogen-containing gas, which is capable of reacting with the sputtering material to form a layer on a substrate. Spent process gas and byproducts are exhausted from the chamber 100 through exhaust ports 146 that receive spent process gas and direct the spent process gas to an exhaust conduit 148 having an adjustable position gate valve 147 to control the pressure in the processing region 110 in the chamber 100. The exhaust conduit 148 is connected to one or more exhaust pump 149, such as a cryopump. Typically, the pressure of the sputtering gas in the chamber 100 during processing is set to sub-atmospheric levels, such as a vacuum environment, for example, a pressure of about 0.6 mTorr to about 400 mTorr. In one embodiment, the processing pressure is set to about 20 mTorr to about 100 mTorr. A plasma is formed between the substrate 105 and the target 132 from the gas. Ions within the plasma are accelerated toward the target 132 and cause material to become dislodged from the target 132. The dislodged target material is deposited on the substrate.

Figure 3A:
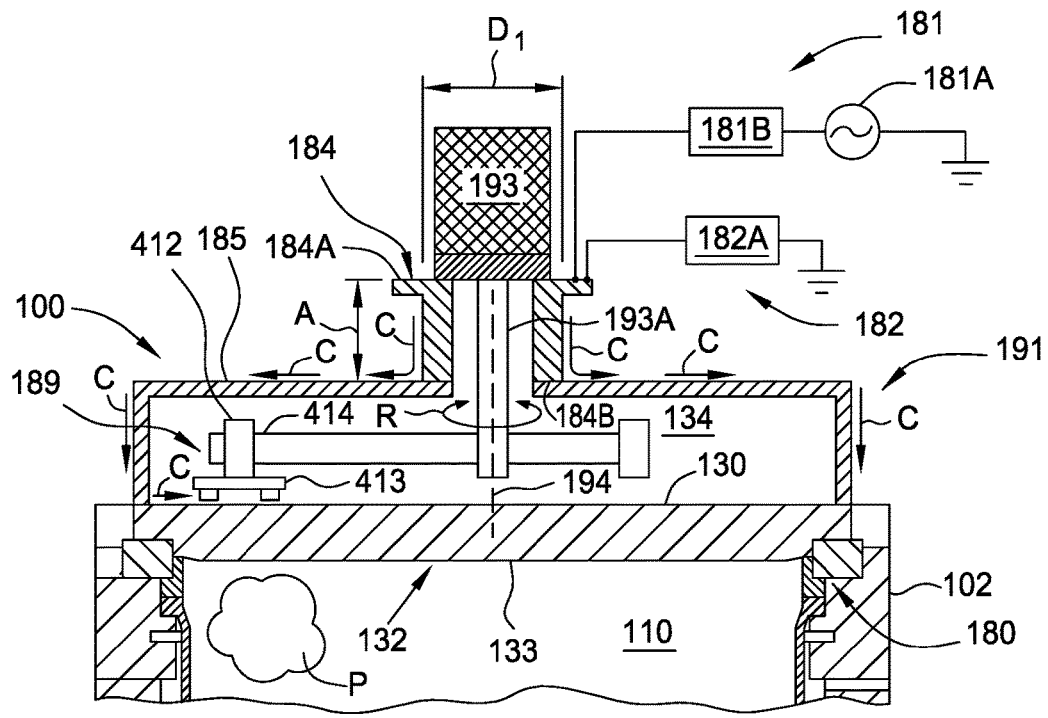
FIG. 3A is a close-up cross-sectional view of a portion of the chamber illustrated in FIG. 1A according to one embodiment of the invention.

Referring to FIG. 3A, the lid enclosure 191 generally comprises a conductive wall 185, a center feed 184 and shielding 186 (FIGS. 1A and 1B). In this configuration, the conductive wall 185, the center feed 184, the target 132 and a portion of the motor 193 enclose and form a back region 134. The back region 134 is a sealed region disposed on the back side of the target 132 and is generally filled with a flowing liquid during processing to remove the heat generated at the target 132 during processing. In one embodiment, the conductive wall 185 and center feed 184 are configured to support the motor 193 and magnetron system 189, so that the motor 193 can rotate the magnetron system 189 during processing. In one embodiment the motor 193 is electrically isolated from the RF or DC power delivered from the power supplies by use of a dielectric layer 193B, such as Delrin, G10, or Ardel.

The shielding 186 may comprise one or more dielectric materials that are positioned to enclose and prevent the RF energy delivered to the target 132 from interfering with and affecting other processing chambers disposed in the cluster tool 103 (FIG. 1B). In one configuration, the shielding 186 may comprise a Delrin, G10, Ardel or other similar material and/or a thin grounded sheet metal RF shield.

Power Deliver

In one embodiment, as illustrated in FIG. 1A, during processing the capacitively coupled target 132 is powered during plasma processing using RF or VHF energy to ionize and dissociate a processing gas near the sputtering surface 133 of the target 132 so that the ionized gas will sputter material from the biased target. However, as processing chamber sizes grow to process 300 mm and larger substrates, due to finite reactor dimensions and boundary conditions on the electrodes, the generated RF fields can inherently form standing waves in the processing region 110 at typical RF and VHF frequencies. If the size of the electrodes becomes comparable with the excitation wavelengths, electromagnetic effects created by the formed standing wave can cause non-uniformities in plasma and the deposited film on the substrate. The standing waves and plasma non-uniformities have a strong influence on the thickness and properties of thin films deposited by PVD reactors or on the process uniformity in plasma processing chambers in general. Non-uniform films may lead to center-to-edge and edge-to-edge non-uniformities, which in some cases may lead to non-functioning devices.

In some cases, the standing wave effects and related plasma non-uniformities may be improved to an extent by shaping the electrodes (e.g., PVD target), lowering the RF frequencies, and tuning the processing parameters, such as chamber pressure, and/or combinations thereof. However, when as the processing chamber size increases to reflect the demand for larger substrates, simply scaling up the aforementioned countermeasures to the standing wave effect and plasma non-uniformities may not be sufficient and/or lead to non-ideal plasma processing conditions.

Figure 3B:
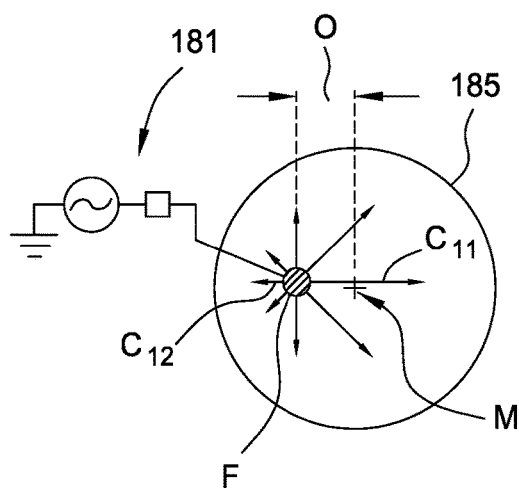
FIG. 3B is a top view of a portion of the chamber illustrated in FIG. 1A according to one embodiment of the invention.

It is believed that these non-uniformities can be further induced and exacerbated as the processing pressures are increased and by the non-symmetric delivery of RF power to the electrode. The non-symmetric delivery of RF power causes an uneven spread of the delivered RF power to the electrode that creates plasma non-uniformity. FIG. 3B is a schematic top view of a target 132 that schematically illustrates the flow of RF power delivered from an asymmetrically positioned power delivery point "F" across the target surface. As shown, the RF power delivery point "F" is offset from the center "M" of the target 132 by a distance "O". In this configuration, the current flow emanating from the power delivery point "F" is non-uniform since it will flow different distances to spread across the surface of the target, for example, as schematically illustrated by the current flow in opposing directions $C_{12}$ and $C_{11}$ that have different path lengths in order to reach the edge of the target 132. It is believed that the uneven flow will setup non-symmetric standing waves in the processing region 110, which will cause plasma and deposition non-uniformity.

Figure 3C:
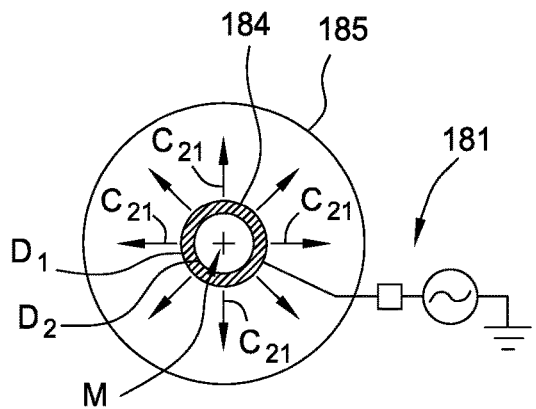
FIG. 3C is a top view of a portion of the chamber illustrated in FIG. 1A according to one embodiment of the invention.

In one embodiment, as illustrated in FIGS. 3A and 3C, the RF power is delivered to a center feed 184 that is positioned at the center "M", or center axis, of the target 132. In this configuration, the RF energy delivered from the RF power source 181A disposed in the RF source 181 is configured to flow through the center feed 184 and the conductive wall 185 to the target 132 during processing. In one embodiment, as shown in FIGS. 3A and 3C, the center feed 184 is axially symmetric about the center "M" of the target 132. In one embodiment, the aspect ratio of the center feed 184 is configured so that the delivery of RF energy at one edge of the upper surface 184A of the center feed 184, as shown in FIG. 3A, will allow the uniform delivery of RF energy to the conductive wall 185 and/or target 132 at the lower surface 184B of the center feed 184. The RF current generally flows along the path shown by arrows "C" in FIG. 3A. In this case, the RF current flow emanating from the center feed 184 (e.g., reference numerals $C_{21}$ in FIG. 3C) will be uniform and the plasma uniformity and affect of the RF standing wave will be minimized and/or removed.

In some embodiments, the center feed 184 may have a length "A" to inner diameter ratio (e.g., diameter "D2"), or diameter aspect ratio, of at least about 1:1. It is believed that, providing a diameter aspect ratio of at least 1:1 or longer provides for more uniform RF delivery from the center feed 184. In one embodiment, the inner diameter, or diameter "D2" of the center feed 184 may be as small as possible, for example, from about 1 inch to about 6 inches, or about 4 inches in diameter. Providing a smaller inner diameter facilitates maintaining a desired diameter aspect ratio without greatly increasing the length of the center feed 184. In some configurations, for example, the center feed 184 may have a length "A" of between about 1 (25.4 mm) to about 12 inches (304.8 mm), or about 4 inches (101.6 mm).

The amount that the RF or VHF current penetrates into a conductive article is a function of the frequency of the current and the material's physical properties. Therefore, the conductivity of the material that the center feed 184 is made from and/or the coatings that are disposed over a surface of the center feed 184 can affect its ability to distribute the delivered RF or VHF current. In one example, the center feed 184 and/or conductive wall 185 are formed from an aluminum (e.g., 6061T6 aluminum) or austenitic stainless steel material. Therefore, in some embodiments, it may be desirable to define a surface area aspect ratio that can be used to design a center feed 184 that has a desirable RF power delivery uniformity. The surface area aspect ratio, which is defined as a ratio of the length "A" of the center feed 184 to the surface area along which the RF power is configured to propagate. In one example, using the configuration illustrated in FIGS. 3A and 3C, the aspect ratio is the length "A" relative to the areas of the surfaces found on diameters $D_1$ and $D_2$ (e.g., $\pi D_1 A + \pi D_2 A$) along which the RF current can flow. In one example, the aspect ratio of a centrally positioned center feed 184 is between about 0.001/mm and about 0.025/mm, such as about 0.016/mm. In another example, a centrally positioned center feed 184 is formed from 6061 T6 aluminum and has a surface area ratio of about 0.006/mm, where the length "A" is about 101.6 mm and the diameter "$D_2$" is about 25.4 mm and diameter "$D_1$" is about 33 mm.

It should be noted that while FIG. 3C illustrates a center feed that is annular in cross-section, this configuration is not intended to be limiting as to the scope of the invention described herein. In some embodiment, the cross-section of the center feed 184 that extends between the upper surface 184A and the lower surface 184B may have a square, hexagonal or other shaped cross-section that is able to substantially evenly distribute the RF power to the conductive wall 185 and/or target 132. It should be noted that the upper surface 184A and the lower surface 184B need not be parallel to each other and thus the length "A" can be defined as the minimum distance between the upper surface 184A and the lower surface 184B.

Magnetron Assembly

To provide efficient sputtering, a magnetron system 189 is positioned in back of the target 132 in the upper process assembly 108 to create a magnetic field in the processing region 110 adjacent the sputtering surface 133 of the target 132. The magnetic field is created to trap electrons and ions to thereby increase the plasma density and to thereby also increase the sputtering rate. According to one embodiment of the invention, the magnetron system 189 includes a source magnetron assembly 420 that comprises a rotation plate 413, an outer pole 421 and an inner pole 422. The rotation plate 413 generally allows the positioning of the magnetic field generating components in the source magnetron assembly 420 to be moved relative to the central axis 194 of the chamber 100.

Figure 4A:
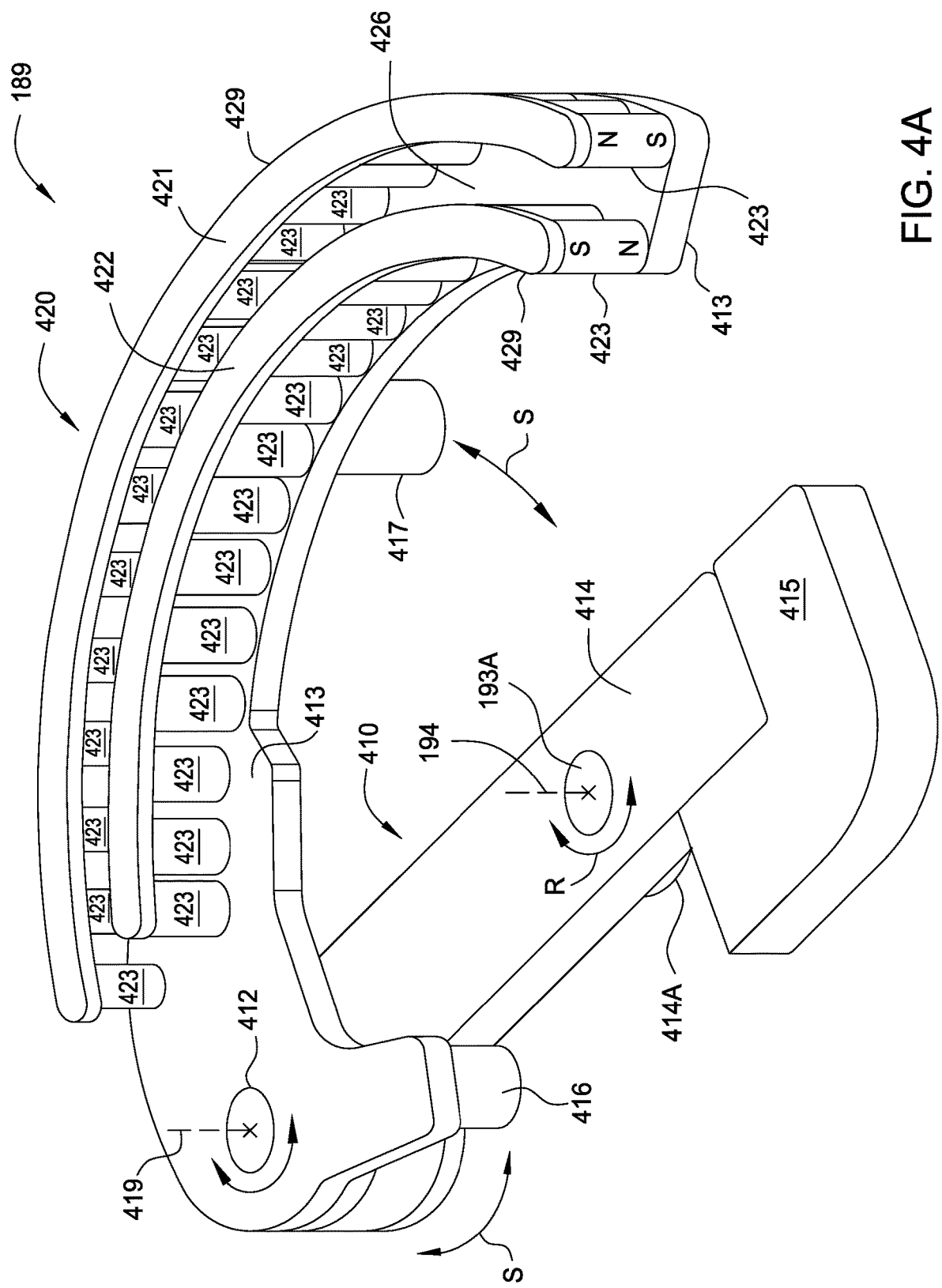
FIG. 4A is an isometric view of a magnetron viewed from the target side according to one embodiment of the invention.
Figure 4C:
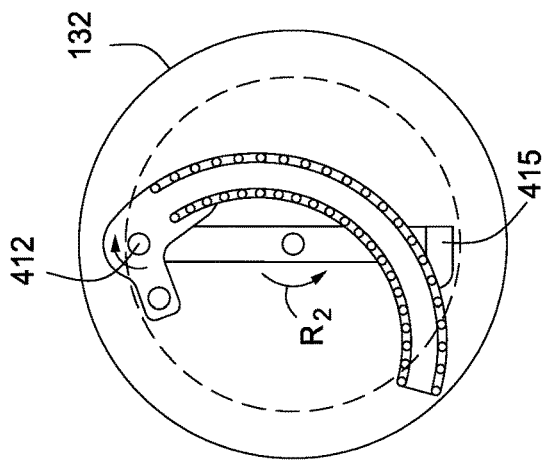
FIG. 4C is a bottom view of a portion of the magnetron according to one embodiment of the invention.
Figure 4D:
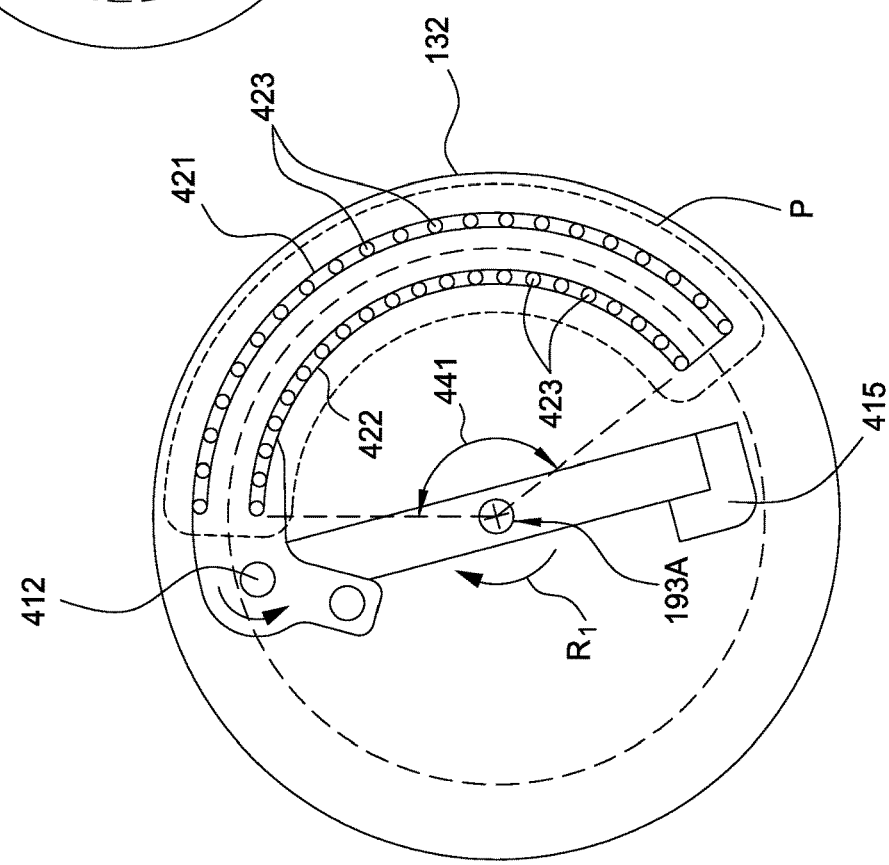
FIG. 4D is a bottom view of a portion of the magnetron according to one embodiment of the invention.
Figure 4B:
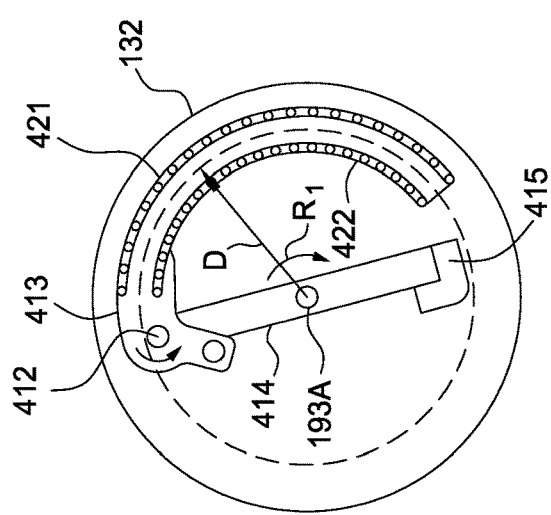
FIG. 4B is a bottom view of a portion of the magnetron according to one embodiment of the invention.

FIGS. 4A, 4B and 4D, illustrate a source magnetron assembly 420 that is positioned at a first radial position relative to the central axis 194, as viewed from the sputtering surface 133 side of the target 132. FIG. 4C illustrates the source magnetron assembly 420 when it is positioned at a second radial position relative to the central axis 194, which is different from the first radial position, and as discussed below is created by adjusting the rotation direction and speed. The rotation plate 413 is generally adapted to support and magnetically couple the outer pole 421 of a first magnetic polarity in the vertical direction and the inner pole 422 having a second magnetic polarity opposite to that of the first magnetic polarity. The inner pole 422 is separated from the outer pole 421 by a gap 426, and each of the poles generally comprises one or more magnets and a pole piece 429. The magnetic field extending between the two poles 421, 422 creates a plasma region "P" (FIGS. 3A, 4D) adjacent a first portion of the sputtering face of the target 132. The plasma region "P" forms a high density plasma region that generally follows the shape of the gap 426.

In one embodiment, as shown in FIGS. 4A-4D, the magnetron system 189 is a non-closed loop design (e.g., open loop design) to reduce the intensity of the plasma formed in the plasma region "P" to compensate for the use of the improved ionization potential created by the delivery of the RF energy, from the RF source 181, to the target 132. One will note that RF-powered plasmas are more effective in increasing the ionization of atoms (e.g., gas atoms and sputtered atoms) in the plasma than a DC-powered plasma, due to the more efficient coupling of the applied energy to the electrons in the plasma and other electron-plasma interaction phenomena that increase the energy of the electrons and enhance the ionization levels in the plasma.

In general, a "closed loop" magnetron configuration is formed such that the outer pole of the magnetron surrounds the inner pole of the magnetron forming a gap between the poles that is a continuous loop. In the closed loop configuration, the magnetic fields that emerge and reenter through a surface of the target form a "closed loop" pattern can be used to confine electrons near the surface of the target in a closed pattern, which is often called a "racetrack" type pattern. A closed loop, as opposed to the open-loop, magnetron configuration is able to confine electrons and generate a high density plasma near the sputtering surface 133 of the target 132 to increase the sputtering yield.

In an open loop magnetron configuration, the electrons trapped between the inner and outer poles will migrate, leak out and escape from the B-fields created at open ends of the magnetron, thus only holding the electrons for a short period of time during the sputtering process due to the reduced confinement of the electrons. However, surprisingly it has been found that the use of an open loop magnetron configuration, as described herein, provides significant step coverage improvements and provides an improved material composition uniformity across the substrate surface, when used in conjunction with the RF and DC sputtering of multi-compositional targets described herein.

In one embodiment of the magnetron system 189, a rotary shaft 193A powered by the motor 193 extends along a central axis 194 and supports a radial shifting mechanism 410, which comprises the rotation plate 413, counterweight 415 and the source magnetron assembly 420. Thereby, the radial shifting mechanism 410 moves the source magnetron assembly 420 in complementary radial directions, such as radially towards or away from the central axis 194 (i.e., reference numerals "S" in FIG. 4A) as the motor 193 is rotated in different directions $R_1$, $R_2$ (FIGS. 4B, 4C).

During processing, sputtering significantly heats the target 132. Accordingly, a back region 134 is sealed to the back of the target 132 and is filled with a liquid of cooling water, which is chilled by an unillustrated chiller and water piping recirculating the cooling water. The rotary shaft 193A penetrates the back chamber 100 through a rotary seal (not shown). The magnetron system 189 including the radial shifting mechanism 410 is immersed in the liquid disposed in the back region 134.

FIG. 4A, which is an isometric view of one embodiment of the magnetron system 189, generally includes a cross arm 414 fixed at its center to the rotary shaft 193A by a clamp 414A. One end of the cross arm supports a counterweight 415. The other end of the cross arm 414, which is across the rotation axis 194 from the counterweight 415, supports a pivot 412, or rotation bearing, that is used to rotatably support the source magnetron assembly 420 for rotation about an offset vertical pivot axis 419. In one configuration, the pivot axis 419 is substantially parallel to the rotation axis 194. In this configuration the magnetron 420 on the cross arm 414 allows it to swing in different and complementary radial directions with respect to the rotation center 194. The complementary motion arises due to the center of mass of the source magnetron assembly 420 being a distance from the pivot axis 419. Thus, as the cross arm 414 and source magnetron assembly 420 are rotated by the motor 193, the centripetal acceleration acting on the source magnetron assembly 420 cause it to pivot about pivot axis 419 in one direction or the other depending on the direction that the motor 193 is turning. The center of mass of the source magnetron assembly 420 may be defined as the center of gravity of the source magnetron assembly 420, which may be in-board of the inner pole 422, or closer to the rotation axis 194, for the configuration illustrated in FIGS. 4A-4D.

The switching between the two positions is effected by reversing the direction of rotation of the rotary shaft 139A about the rotation axis 194 and hence of the entire magnetron system 189 about the rotation axis 194. As illustrated in the top plan view of FIG. 4D, when the rotary shaft 139A rotates the cross arm 414 in the clockwise direction $R_1$ about the rotation axis 194, the inertia and impeding forces cause the source magnetron assembly 420 to rotate in the counter-clockwise direction about the pivot axis 419 until the bumper 416 fixed to the source magnetron assembly 420 engages one side of the cross arm 414. In this processing configuration, or magnetron processing position, the source magnetron assembly 420 is disposed at its radially outward position close to the edge of the target 132, so that the source magnetron assembly 420 can support a plasma for sputter deposition or sputter etching of the substrate 105. This position may be referred to as a magnetron "out" position or first position.

Alternately, as illustrated in the top plan view of FIG. 4C, when the rotary shaft 193A rotates the cross arm 414 in the counter-clockwise direction $R_2$ about the rotation axis 194, the inertia and impeding forces cause the source magnetron assembly 420 to rotate in a clockwise direction about the pivot axis 419 until the bumper 417 (FIG. 4A), which is fixed to the source magnetron assembly 420 engages the other side of the cross arm 414. In this configuration, the source magnetron assembly 420 is disposed at its inward location away from the edge of the target 132 and closer to the rotation axis 194 so that the source magnetron assembly 420 can support a plasma near the center of the target to clean this region. This position may be referred to as a magnetron "in" position or second position.

In some embodiments, the source magnetron assembly 420 is an unbalanced magnetron. In one embodiment, the relative imbalance is small and thus is near a ratio of one. Typically, the imbalance is defined as the ratio of the total magnetic intensity or magnetic flux integrated over the outer pole 421 divided by the total magnetic intensity or magnetic flux integrated over the inner pole 422. It has been found that keeping the outer to inner field strength imbalance between about 0.5 and about 1.5 the RF deposition process of multi-compositional films can be improved. In one embodiment, the outer to inner field strength imbalance is a ratio of between about 18:17 and about 20:16. The magnetic imbalance causes part of the magnetic field emanating from the outer pole 421 to project towards the substrate 105 and guide ionized sputter particles to the substrate 105. Because the source magnetron assembly 420 is spread over a wide area of the target this tends to broaden the plasma region "P" and reduce its overall plasma intensity created by the delivery of the RF and DC power to the target 132. However, the source magnetron assembly 420 will create a higher density plasma in the plasma region "P" versus portions of the target 132 that are not directly adjacent to the source magnetron assembly 420. As a result, the target 132 is primarily sputtered in the area that the source magnetron assembly 420 sweeps and the formed plasma causes a sizable fraction of the sputtered particles to be ionized. The ionized particles are at least partially guided towards the substrate 105 by the unbalanced magnetic field.

In one embodiment, as noted above and illustrated in FIGS. 4A and 4D, the source magnetron assembly 420 is formed in a non-closed loop design to reduce the intensity of the plasma formed in the plasma region "P". In this configuration, the non-closed loop design is formed in an arc shape that has a radius D (FIGS. 4B and 4D), which extends from the arc center to the center of the gap 426. The arc may be sized and positioned so that the center of the radius D of the arc is coextensive with the center of the rotation axis 194 when it is disposed in the magnetron in a first processing position. In one embodiment, the formed arc has a radius between about 7.3 inches (185 mm) and 8.3 inches (210 mm) and the target 132 has a diameter of about 17.8 inches (454 mm). In one embodiment, the arc is circular in shape and subtends an angle 441 (FIG. 4D) between about 70 and about 180 degrees, such as about 130 degrees. In one embodiment, the distance from the rotation axis 194 to the pivot axis 419 is equal to about the radius D of the arc.

In one embodiment, the outer pole 421 and inner pole 422 each comprise a plurality of magnets 423 that are positioned in an array pattern on either side of the gap 426 and are capped by a pole piece 429 (FIG. 4A). In one configuration, the north (N) poles of the magnets 423 in the outer pole 421 are positioned away from the rotation plate 413 and south (S) poles of the magnets 423 in the inner pole 422 are positioned away from the rotation plate 413. In some configurations, a magnetic yoke (not shown) is disposed between the magnets of the inner and outer poles and the rotation plate 413. In one example, the source magnetron assembly 420 comprises an outer pole 421 that has 18 magnets contained therein and an inner pole 422 that has 17 magnets contained therein, where the magnets 423 are made from an Alnico alloy, rare-earth material, or other similar material. In one embodiment, the magnets 423 are each configured to create a magnetic field having a strength, at or near their tip, of between about 1.1 kGauss and about 2.3 kGauss. In one embodiment, the gap 426 and outer pole 421 and/or inner pole 422 are uniform in width across the formed arc. In one embodiment, the arc has a width of about 1 to about 1.5 inches (38.1 mm).

Figure 10A:
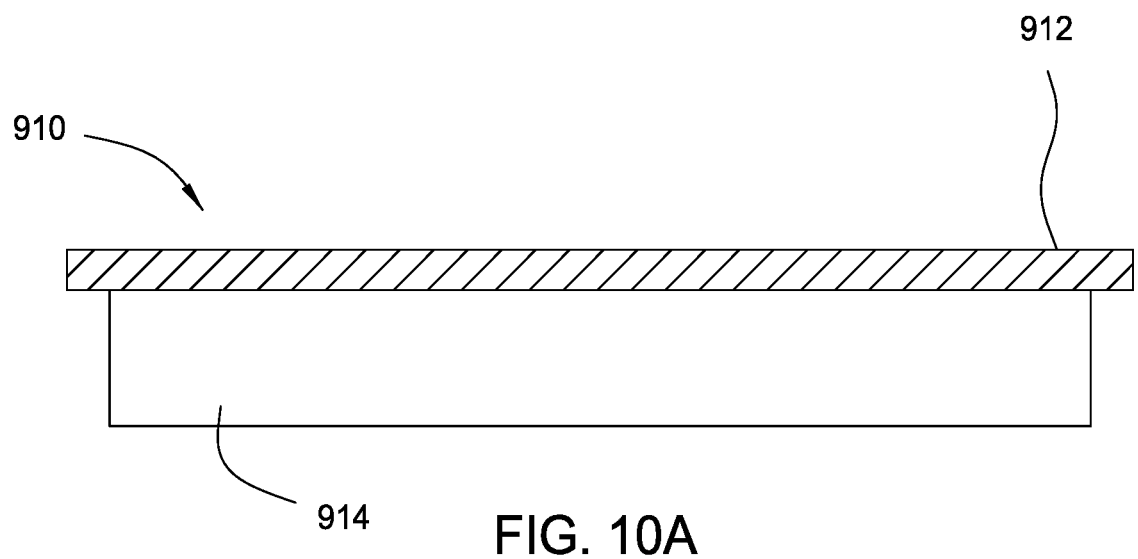
FIGS. 10A-10C illustrate the erosion tracks formed in a sputtering target during processing.
Figure 10B:
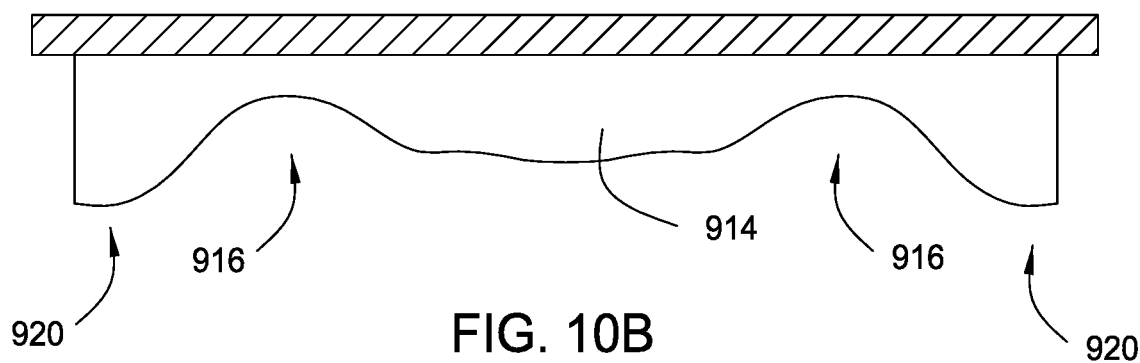

It has been found that the uniformity of sputter deposition is improved if the source magnetron assembly 420 is positioned on a radially outer portion of the target 132. However, if the principal sputtering is occurring in an outer circumferential band of the target 132, some of the sputtered target atoms are likely to redeposit on inner portions of the target 132. It is believed that, since the relative sputtering rate occurring away from the source magnetron assembly 420 is likely small, the redeposited material is likely to build up towards the rotation axis 194. If the redeposited film grows sufficiently thick, it is likely to flake off and create significant particles, thereby degrading the quality of the film deposited on the substrate 105 and any devices formed near the particles falling from the middle of the target 132. Therefore, in one configuration, as shown in FIG. 4C, the rotation direction of the shaft 193A is changed by commands sent from the controller 190 to cause the source magnetron assembly 420 to pivot about the pivot 412 to a position that enhances the sputtering of material near the center of the target 132. In one configuration the centrally positioned magnetron assembly 420 will allow the generated plasma to extend near and/or over the center of the target 132 to remove the redeposited material disposed thereon. As further discussed below, the redeposited material on the target surface can affect the composition of the sputter deposited layer formed on the substrate, because of the difference in material composition of regions of the exposed target surface 133 over time due to the preferential redeposition of one sputtered element versus another on regions of the target surface 133 outside of the formed magnetron "race track," or erosion grooves 916 (FIG. 10B). Areas outside the "race track" generally include regions outside of the erosion groove(s) 916, such as the center region 918 and an outside edge region of the target 920. Sputtering of the regions that are outside of the magnetron created erosion groove(s) 916 is much more of an issue in RF generated plasmas versus pure DC generated plasmas due to the increased ease in uniformly generating a plasma across the target surface by the delivery of RF energy to the target.

Figure 4E:
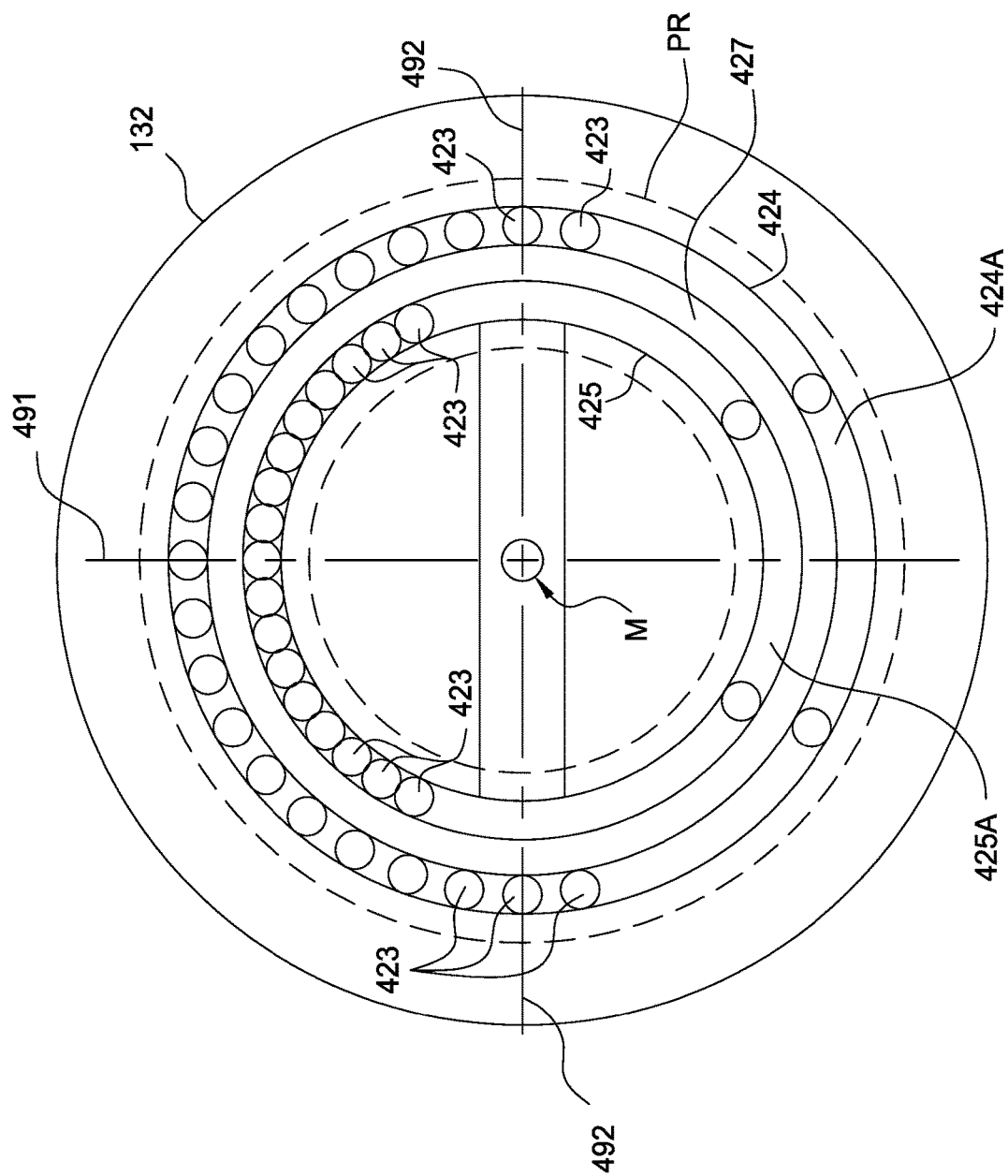
FIG. 4E is a top view of a portion of the magnetron according to one embodiment of the invention.

FIG. 4E illustrates an alternate embodiment of the magnetron system 189 in which an outer pole 424 and an inner pole 425 form a closed loop ring magnetron that is centered about the center "M" of the target 132. In one embodiment, a radially symmetric shaped magnetron design is used that is an imbalanced and non-magnetically symmetric closed loop magnetron design that may be useful for depositing a film using an RF and DC plasma.

In one embodiment, the magnets 423 disposed in the outer pole 424 and inner pole 425 are distributed symmetrically about a first axis 491 and asymmetrically distributed about a second axis 492. In one embodiment, the outer pole 424 and inner pole 425 have an outer to inner field strength imbalance between about 0.5 and about 1.5 at a point between the outer pole 424 and inner pole 425 along the first axis 491. In another embodiment of the imbalanced closed loop design, the imbalance between the outer pole 424 and inner pole 425 at a point between the outer pole 424 and inner pole 425 along the first axis 491 has a ratio between about 18:17 and about 20:16, outer to inner field strength. It is noted that the magnetic field imbalance between the inner and outer poles is different than the asymmetry of the magnets 423 relative to the second axis 492, since the imbalance relates to the fields created between the poles and the asymmetry relates to the presence, or variation in average magnetic field strength, at various regions across the surface of the target. In this configuration, an unbalanced closed loop magnetron is used to create a ring shaped plasma region "PR" that may be centered about the gap 427.

The plasma density will generally be higher in the processing region adjacent to a region of the magnetron system 189 above the second axis 492 (FIG. 4E), or region having the highest density of magnets 431, versus the region of the magnetron system 189 below the second axis 492, or region having the lowest density of magnets, or no magnets. While the pole piece plates 424A, 425A coupled in the outer pole 424 and inner pole 425, respectively, are circular and are magnetically conductive, the magnetic field created between the poles along the first axis 491 in the region below the second axis 492 will be significantly lower than the magnetic field created between the poles along the first axis 491 in the region above the second axis 492.

In one example, the magnetic field strength at a point between the outer pole 424 and inner pole 425 along the first axis 491 below the second axis 492 is orders of magnitude less than the magnetic field strength at a point between the outer pole 424 and inner pole 425 along the first axis 491 above the second axis 492, or even having a magnitude of nearly zero. In this configuration, it is believed that the electrons positioned adjacent to the less magnetized region, such as the half section of the below the second axis 492 shown in FIG. 4E, are better able to escape the formed closed loop between the inner and outer poles, and thus move radially toward the target center "M". The escaped electrons can thus help to increase the ionization of gases near the center region of the target to improve target utilization. In one embodiment, the inner diameter of the magnetron is 6.5 inches and the outer diameter is 8.3 inches. The magnetron spins on a generally central axis above the target and the chamber, and thus in one embodiment is configured to be rotated about its center "M" by the motor 193 during processing.

Substrate Deposition Process Control

In one embodiment of the processing chamber 100, an impedance controller 141 (FIG. 1A) is coupled between an electrode and RF ground to adjust the bias voltage on the substrate during processing to control the degree of bombardment on the substrate surface. In one embodiment, the electrode is disposed adjacent to the substrate receiving surface 127 of a support 126, and comprises the electrode 126A. In a PVD reactor, tuning of the bombardment of the substrate surface by the control of the impedance of the electrode to ground, will affect step coverage, overhang geometry and deposited film's properties, such as grain size, film stress, crystal orientation, film density, roughness and film composition. Therefore, the impedance controller 141 can thus be used to alter the deposition rate, the etching rate and even the composition of a multi-compositional film at the substrate surface. In one embodiment, the impedance controller 141 is employed to enable or prevent deposition or etching, by the appropriate adjustment of impedance of the electrode/substrate to ground.

Figure 6:
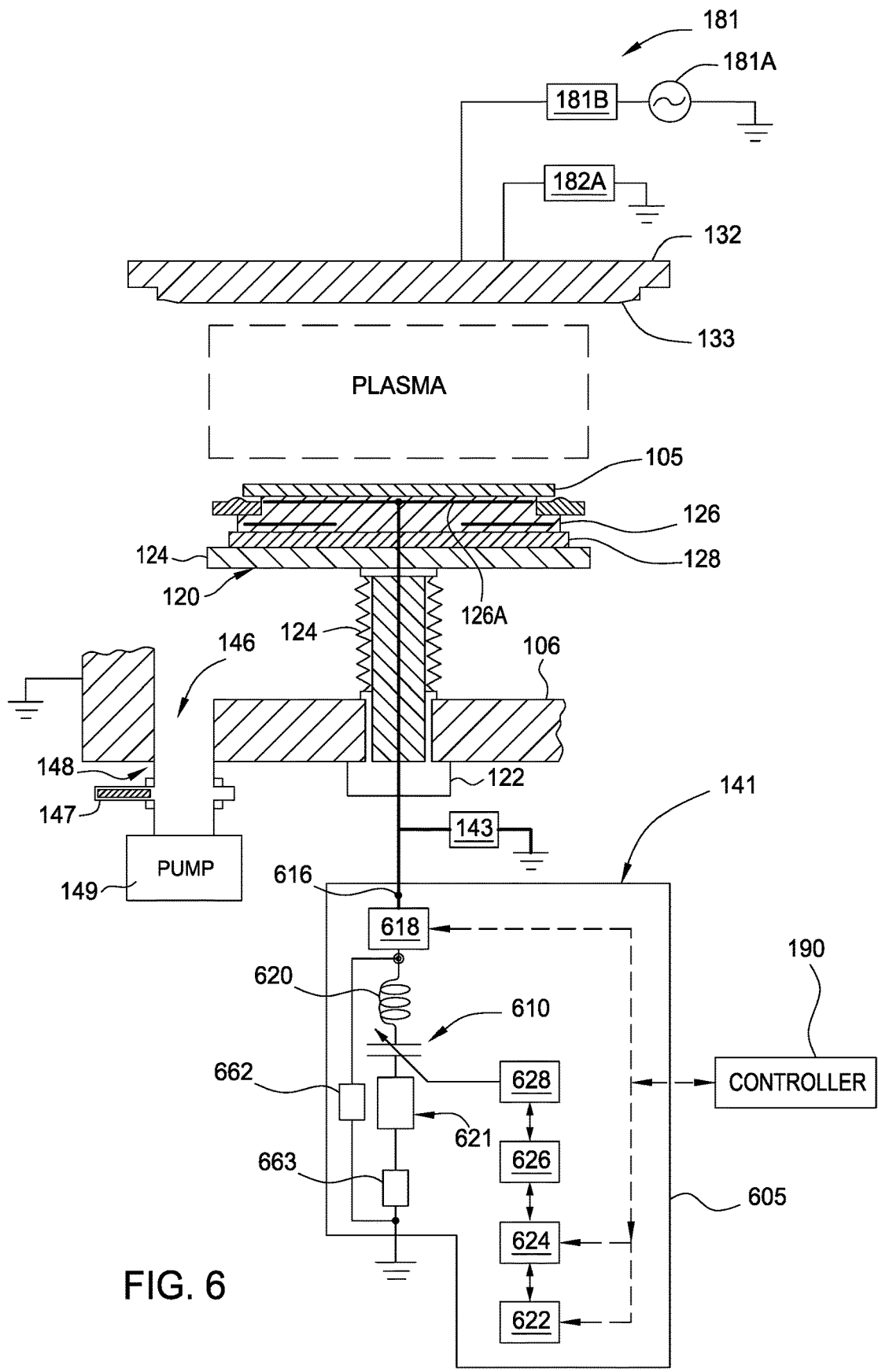
FIG. 6 is a schematic view of an impedance controller according to one embodiment of the invention.

FIG. 6 illustrates one embodiment of the impedance controller 141 that has a variable capacitor tuning circuit with a feedback circuit to control the properties of a deposited metal or non-metal layer on a substrate. As discussed below, the variable capacitive tuning circuit can be automated for a given set point during one or more parts of a PVD deposition recipe step. The actual impedance set point can be adjusted based on the measured current or bias voltage, or by some user defined set point, such as percentage of the full scale of the capacitance of the variable capacitor. The set point can depend on the desired processing results to be achieved on the substrate.

Referring to FIG. 6, the impedance controller 141 can include a variable capacitor 610, an input 616, an optional output circuit 618, an optional inductor 620, optional resistor 621, an interface 622, a processor 624, a motor controller 626 and a motor 628. The motor 628 is preferably a stepper motor that is attached to the variable capacitor 610 in a manner to be able to vary the capacitance of the variable capacitor 610. The addition of an inductor 620 may be optional, and generally can be effective to dampen or compensate for the variation in inductance created by having different cable lengths between the impedance controller 141 and the electrode 126A in different chamber setups. The addition of the inductor 620 may be useful to prevent the need to re-calculate the impedance control set points for every different chamber position and configuration in the cluster tool 103.

Also, the output circuit 618 is optional, and can include a sensor to determine the substrate bias voltage during processing. The sensor can be a voltage sensor or a current sensor. These sensors can be used to provide feedback to control a motor and to control the operational set point of the variable capacitor 610. The output circuit 618, if included, can provide a feedback signal to the interface 622. The interface 622 provides the feedback signal to the processor 624 and controller 190. The processor 624 can be a dedicated electric circuit or it can also be a microprocessor or microcontroller based circuit.

The variable capacitor 610 setting is used to adjust the impedance to ground and thus adjust the plasma and ion interaction with the substrate during processing. The variable capacitor 610 is connected to the input 616, which is coupled to the electrode 126A. In one embodiment, the input 616 is coupled to the electrode 126A through one or more additional components, such as the optional inductor 620. In accordance with various aspects of the present invention, it is contemplated that other components can be provided in the circuit of FIG. 6. In one example, the variable capacitor 610 has a capacitance that varies from between about 50 picoFarads (pF) and about 1000 picoFarads (pF) and the optional inductor 620 has an inductance of about 0.26 microhenries (μH).

The interface 622 can also receive a signal from the motor controller 626. The processor 624 controls the motor controller 626 which controls the motor 628 in accordance with the signal and the received information from the outputs of the sensors. The motor controller 626 causes the motor 628, which is preferably a stepper motor, to step through its positions to vary the capacitance of the variable capacitor 610 as a function of the mode control signal and of the outputs of the sensors.

In accordance with one aspect of the invention, the impedance controller 141 is contained in a housing 605 that is mounted to the processing chamber 100. By mounting the impedance controller 141 to the processing chamber 100, the control of the bias voltage on substrate can be more easily controlled and more efficient.

The processor 624 can also be a special purpose interface circuit. The main purpose of the interface circuit or processor 624 is to control the motor controller 626 based on the input received from a sensor, such as voltage sensor 662 or the current sensor 663 that are attached to a portion of the circuit formed in the impedance controller 141, as just described. If the processor 624 specifies a desired bias voltage set point, then the motor controller 626 is controlled to generate the capacitance to achieve the set point. For example, if the processor 624 is controlling the substrate bias voltage based on a measured voltage in the impedance controller 141, then the motor controller 626 controls the motor 628 in accordance with the output of the voltage sensor 662 to maintain a constant voltage in the circuit. In another example, if the processor 624 is controlling the substrate bias voltage based on a measured current in the impedance controller 141, then the motor controller 626 controls the motor 628 to maintain a constant current through the circuit. Any type of well known voltage sensor can be used in accordance with the various aspects of the present invention and can be connected between the processing chamber side of the variable capacitor 610 and ground. Similarly, any type of well know current sensor (not shown) can be used in accordance with the various aspects of the present invention. Both voltage sensors and current sensors are well known in the art.

Lower Process Kit and Substrate Support Assembly

Figure 5A:
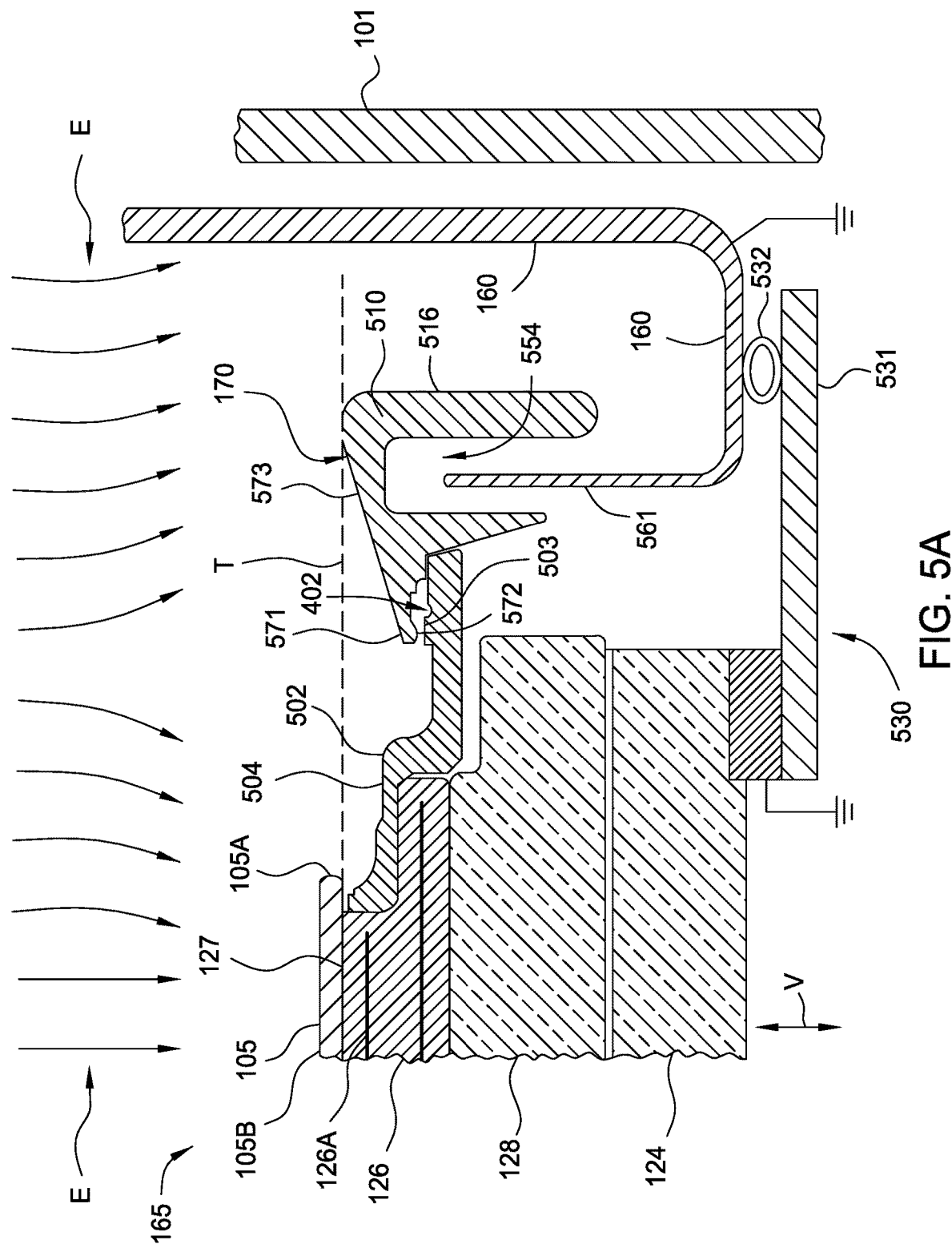
FIG. 5A is a cross-sectional view of a portion of a process kit according to one embodiment of the invention.

Referring to FIGS. 1A and 5A, the lower process kit 165 comprises a deposition ring 502 and a cover ring 170. The deposition ring 502 is generally formed in an annular shape, or annular band, surrounding the support 126. The cover ring 170 at least partially covers a portion of the deposition ring 502. During processing the deposition ring 502 and the cover ring 170 cooperate with one another to reduce formation of sputter deposits on the peripheral edges 129 of the support 126 and the overhanging edge 105A of the substrate 105.

The cover ring 170 encircles and at least partially covers the deposition ring 502 to receive, and thus, shadow the deposition ring 502 from the bulk of the sputtering deposits. The cover ring 170 is fabricated from a material that can resist erosion by the sputtering plasma, for example, a metallic material such as stainless steel, titanium or aluminum, or a ceramic material, such as aluminum oxide. In one embodiment, the cover ring 170 is formed from a stainless steel material. In one embodiment, a surface of the cover ring 170 is treated with a twin-wire aluminum arc-spray coating, such as, for example, CLEANCOAT™, to reduce particle shedding from the surface of the cover ring 170. In one embodiment, the deposition ring 502 is fabricated from a dielectric material that can resist erosion by the sputtering plasma, for example, a ceramic material, such as aluminum oxide.

The cover ring 170 comprises an annular ring 510 comprising a top surface 573 that is sloped radially inwards and encircles the support 126. The top surface 573 of the annular ring 510 has an inner periphery 571 and an outer periphery 516. The inner periphery 571 comprises a projecting brim 572 which overlies the radially inward dip comprising an open inner channel of the deposition ring 502. The projecting brim 572 reduces deposition of sputtering deposits on the open inner channel disposed between the surface 503 of the deposition ring 502 and the projecting brim 572. The projecting brim 572 is sized, shaped, and positioned to cooperate with and complement the arc-shaped gap 402 to form a convoluted and constricted flow path between the cover ring 170 and deposition ring 502 that inhibits the flow of process deposits onto the support 126 and the platform housing 128.

The top surface 573 may be inclined at an angle of between about 10 degrees and about 20 degrees from the horizontal. The angle of the top surface 573 of the cover ring 170 is designed to minimize the buildup of sputter deposits nearest to the overhanging edge of the substrate 105, which would otherwise negatively impact the particle performance obtained across the substrate 105. The cover ring may comprise any material that is compatible with process chemistries such as titanium or stainless steel. In one embodiment, the cover ring 170 has an outer diameter, that is between about 15.5 inches (39.4 cm) and about 16 inches (40.6 cm). In one embodiment, the cover ring 170 has a height between about 1 inch (2.5 cm) and about 1.5 inches (3.8 cm).

The space or gap 554 between the ring support portion 561 of the shield 160 and the cover ring 170 forms a convoluted S-shaped pathway or labyrinth for plasma to travel. The shape of the pathway is advantageous, for example, because it hinders and impedes ingress of plasma species into this region, reducing undesirable deposition of sputtered material.

In one embodiment, as shown in FIG. 5A, the cover ring 170 is designed and positioned relative to the grounded shield 160 during processing, so that will not be in contact with the grounded shield, and thus will electrically "float". Further, in one embodiment, it is desirable to position the cover ring 170 and deposition ring 502 so that they are a distance from the substrate 105 and below the substrate receiving surface 127 of the support 126 to allow the electric field "E" created by the delivery of RF and/or DC power to the target 132 to be more uniform across the surface of the substrate during processing. It is believed that electrically floating surfaces, such as the surfaces of the cover ring 170 will be subject to electron bombardment during various parts of the delivered RF power's half-cycle, thus affecting the uniformity of the RF electric field in a region near the edge 105A of the substrate 105. Bombardment is believed to occur when the RF potential from the power source 181A at the top surface 573 is more positive than the average DC potential formed at the top surface 573. Therefore, in one embodiment, it is desirable to assure that the deposited film layer formed on the upper surfaces of the cover ring 170 does not have an electric path to ground and that it is disposed a distance away from the edge 105A of the substrate 105. In one example, the inner periphery 571 of the cover ring 170 is disposed a distance of at least 0.5 inches (12.7 mm) from the edge 105A of the substrate 105. In another example, the inner periphery 571 of the cover ring 170 is disposed a distance of between about 0.5 inches (12.7 mm) and about 3 inches (76.2 mm), such as about 1 inch (25.4 mm) from the edge 105A of the substrate 105.

Figure 5B:
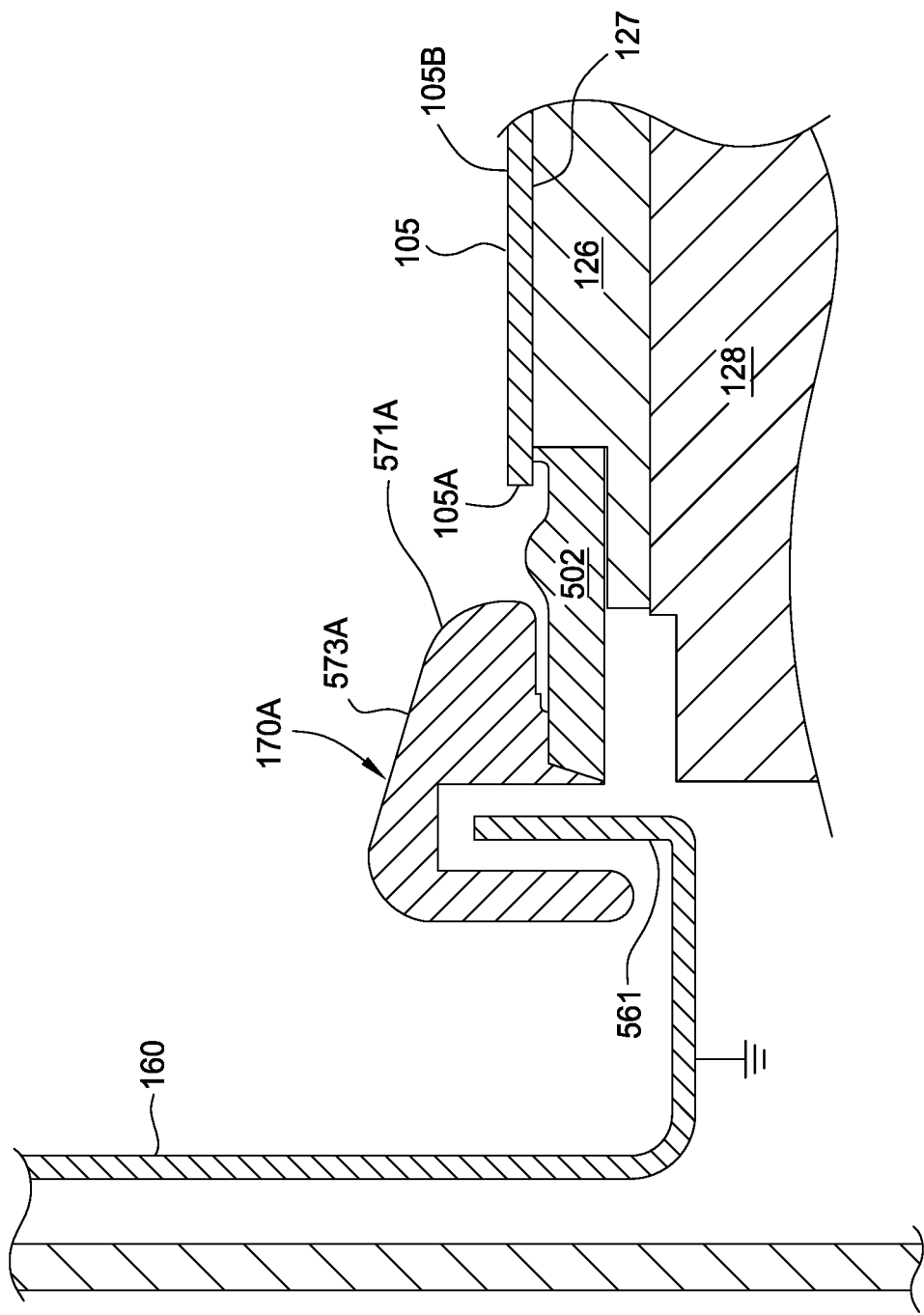
FIG. 5B is a cross-sectional view of a portion of a conventional process kit.

It has also been found that the placement of electrically floating surfaces, such as the surfaces of the cover ring 170, above the exposed surfaces of the substrate 105, or above the substrate receiving surface 127, will have an undesirable affect on the deposited film uniformity across the substrate 105. FIG. 5B illustrates a conventional processing kit configuration in which the inner periphery 571A and top surface 573A of a conventional cover ring 170A are positioned above the substrate receiving surface 127 and surface 105B of the substrate 105. It has been found in these conditions that the deposited layer tends to be thin near the edge of the substrate 105. It is believed that the reduced deposition near the substrate edge 105A is created by the increased deposition of the ionized deposited film atoms on the top surface 573 of the cover ring 170, due to the increased interaction of the plasma with the process kit surfaces disposed above the substrate surface 105B. Therefore, in one embodiment, the cover ring 170 and deposition ring 502 are positioned below the substrate receiving surface 127, which as shown in FIG. 5A as being below the extension line "T". In one embodiment, the cover ring 170 and deposition ring 502 are positioned below the substrate receiving surface 127 (e.g., extension line "T") by about 0.2 inches (5 mm) It should be noted that while the discussion herein and illustrations in FIGS. 1A-6 all describe the substrate receiving surface 127 as being positioned below the target 132, and the cover ring 170 and deposition ring 502 being below the substrate receiving surface 127, this vertically oriented configuration is not intended to be limiting as to the scope of the invention described herein, and is only used as a reference frame to define the relative order and/or distances of each of the components to one another. In some embodiments, the substrate receiving surface 127 can be positioned in other orientations relative to the target 132 (e.g., above, horizontally aligned), while the cover ring 170 and deposition ring 502 are still disposed a distance further from the target 132 than the substrate receiving surface 127 is from the target 132.

In another embodiment, it is desirable to assure that a deposited film layer formed on the upper surfaces 504 of the deposition ring 502, which is formed from a dielectric material, does not have an electric path to ground to prevent the electric field in the region near the edge 105A of the substrate from varying over time (e.g., process a kit life). To prevent the film layers deposited on the upper surfaces 504 from making electrical contact with the shield 160 and cover ring 170, the projecting brim 572 of the cover ring 170 is sized, shaped, and positioned to prevent the deposition on the deposition ring 502 from forming a bridge with the layers deposited on the cover ring 170 and from making their way to the shield 160.

The components of the lower process kit 165 work alone and in combination to significantly reduce particle generation and stray plasmas. In comparison with existing multiple part shields, which provided an extended RF return path contributing to RF harmonics causing stray plasma outside the process cavity, the one piece shield described above reduces the RF return path thus providing improved plasma containment in the interior processing region. The flat baseplate of the one piece shield provides an additional shortened return path for RF through the pedestal to further reduce harmonics and stray plasma as well as providing a landing for existing grounding hardware.

Referring to FIG. 5A, in one embodiment, the pedestal assembly 120 further comprises a pedestal grounding assembly 530 that is adapted to assure that the bellows 124 are grounded during processing. If the bellows 124 achieve a different RF potential than the shield 160 it can affect the plasma uniformity and cause arcing to occur in the processing chamber, which will affect the deposited film layer's properties, generate particles and/or affect the process uniformity. In one embodiment, the pedestal grounding assembly 530 comprises a plate 531 that contains a conductive spring 532. The conductive spring 532 and plate 531 are configured to make electrical contact with a surface of the shield 160 when the pedestal assembly 120 is moved to the processing position (shown in FIG. 5A) in a direction "V" by the lift mechanism 122. The conductive spring 532 may disengage from the shield 160 when the pedestal assembly 120 is moved to the transfer position (shown in FIG. 1A) in a direction "V'" by the lift mechanism 122.

Processing Details

Embodiments of the present invention provide an apparatus and methods for forming integrated circuit devices, such as CMOS type integrated circuits. However, embodiments of the invention may also be used for forming various semiconductor devices, thin-film-transistors, etc. In one embodiment, the apparatus are adapted to perform metal deposition when forming a high-k/metal gate type structure, in particular when using a "gate last" approach. The general principles of this invention have been shown to apply to the deposition of various different metals and compounds, such as tungsten (W), tungsten nitride (WN), titanium (Ti), titanium nitride (TiN), and titanium-aluminum (TiAl) alloy, HfC, HfN, silicides for FUSI, and Al. In one example, the embodiments disclosed herein are useful for depositing a layer comprising at least two different elements, such as a titanium aluminum (TiAl) layer that has a 50-50 alloy composition.

As device structures get smaller, especially in device formed in the sub-45 nm nodes, good film step-coverage inside an integrated circuit structure is essential to form the various device components in a functional semiconductor device, such as a metal gate, contact, and interconnect features. Various methods have been used to improve PVD step-coverage, such as long target-substrate spacing, ionized metal plasma (IMP), application of strong magnetic fields by a magnetron, re-sputtering, etc. Embodiments of the invention use a high pressure process, combined with RF and DC sputtering, and capacitive coupling, among others. In this configuration, which is different from IMP, the RF power is applied directly to the target instead of a coil. The high pressure with RF power generates high density plasma near the target.

When sputtered using a high pressure with RF plasma, atoms or species passing through the plasma, are more easily ionized, which significantly increases the ion/neutral ratio. Additionally, when atoms or species approach the substrate in a high pressure ambient, many collisions may happen which help reduce the energy of species in a vertical direction, normal to the substrate surface, and increase its movement in a direction parallel to the substrate. Also different from IMP, since species get ionized near the target, and are not accelerated and/or guided by an external electromagnetic field as in an IMP process, the RF deposition process will provide better sidewall coverage compared to an IMP type process (e.g., inductive coil). Additionally, the plasma tends to form at a distance away from the substrate, helping to reduce plasma damage which makes this method suitable for contact, metal gate, and other front end applications.

Embodiments of the invention include methods to improve the film uniformity and step-coverage for this deposition process. Other advantages of this process may include no bottom coverage asymmetry and less bottom coverage dependency on structure size. While the description below primarily discusses the processes of metal gate formation, this configuration is not intended to be limiting as to the scope of the invention described herein. Embodiments of the invention provide the ability to deposit metals having a desirable work-function for high-k metal gates, such as in forming MOSFET devices as previously described, particularly for the "gate replacement" or "gate last" methods. Metals having a desirable work-function, which are used for high-k metal gate stacks, are desirable as an alternative to adjusting threshold voltages semiconductor devices. The work function of different materials, including metals, varies, and will be chosen based on the requirements for the particular semiconductor device, such as a CMOS semiconductor device.

Additionally, embodiments provide the ability to sputter using RF energy to decrease damage on the substrate compared to traditional PVD processes. Embodiments also provide the ability to use the benefits of high electron containment to control targeted erosion using magnets in a magnetron and DC power, and the more diffuse plasma (full-face erosion) created using an RF energy. Moreover, the embodiments provide the ability to lower deposition rates for control over thin films (10 Å or less) and to sputter dielectric materials (e.g. LaOx, AlOx, etc). Other potential novel work function materials like TixAlyN may be controlled to achieve desired stoichiometries and work functions.

Embodiments of the invention also provide continuous path shields for good RF containment and coherent return path in addition to a simple form for a reduced cost manufacturing method. The low profile cover ring and deposition ring design disclosed herein allow an RF-DC PVD source to be used in high-pressure applications that require good step coverage at very low film non-uniformity. The substrate support includes capacitive tuning to improve the deposited film properties and film uniformity. The variable capacitor allows the impedance of the RF grounding path to be adjusted, so that the process uniformity for multiple recipe types/conditions can be adjusted.

The deposition of work function metals for the replacement gate application for MOSFET devices such as CMOS metal gates below the 45 nm node requires that films be deposited with good step coverage (bottom thickness/field thickness) for features with top openings from 35 nanometers (nm) down to 12 nm and aspect ratios ranging from 2.5 to 5. An RF-DC PVD chamber forming "gate first" applications have typically been formed at low pressures (around 2 mTorr) leading to highly uniform films deposited on the field region of the substrate, but not in the features. These low pressure deposited films may have poor step coverage that is on the order of 15-20%. In order to achieve the high step coverage, such as 75% and higher, which is desired for the "replacement gate" approach, a high pressure process may be used.

FIGS. 7A-7H illustrates cross-sections of a MOSFET transistor, such as a CMOS transistor 700 during processing. The CMOS transistor 700 incorporates a gate dielectric layer, a gate metal layer, and distinct work function metals along the gate wall such as a p-metal and an n-metal. The figures illustrate a substrate on which a gate dielectric layer and gate metal layer are disposed. Side wall spacers are shown adjacent to the vertical sidewalls of gate dielectric layer and gate metal layer. Embodiments of the invention may be used to form the gate stack of the MOSFET transistor shown in FIGS. 7A-7H.

Figure 7A:
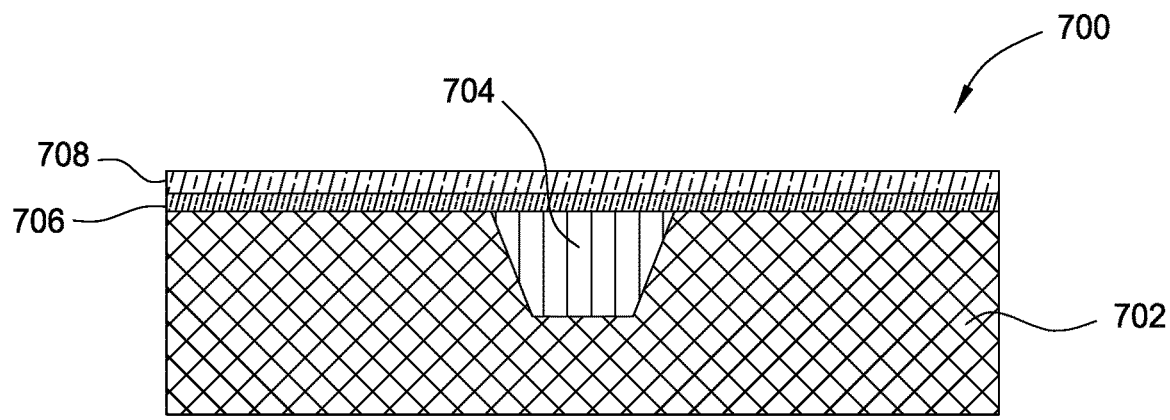
FIGS. 7A-7H depict a schematic cross section of an example of a process for forming a CMOS type integrated circuit.
Figure 7B:
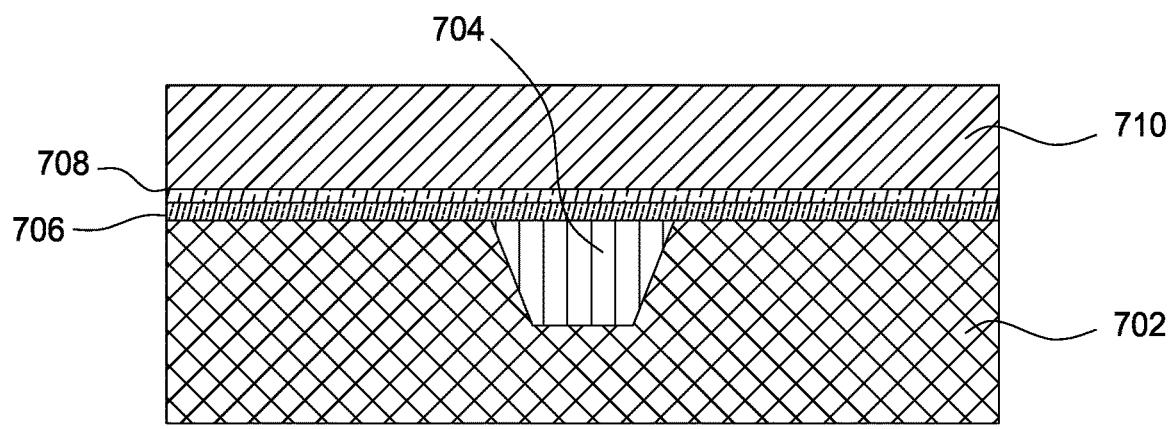
Figure 7C:
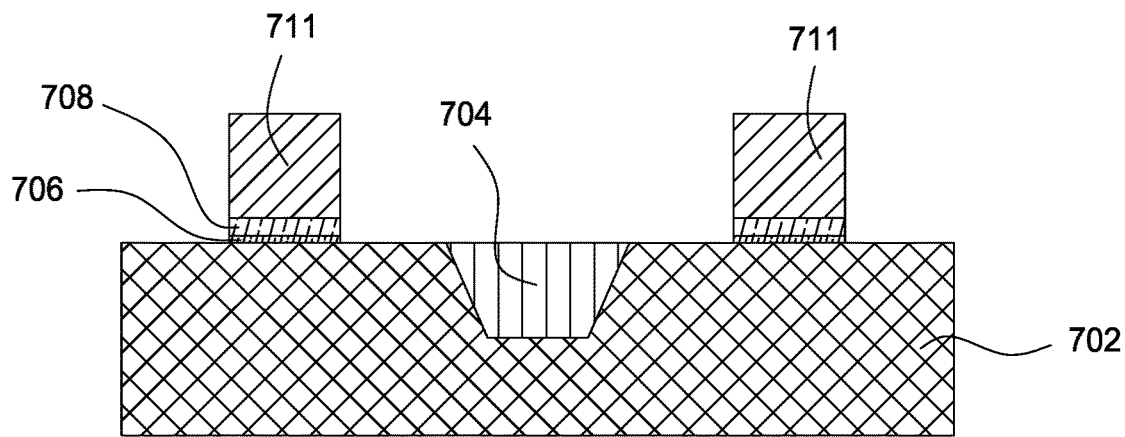
Figure 7D:
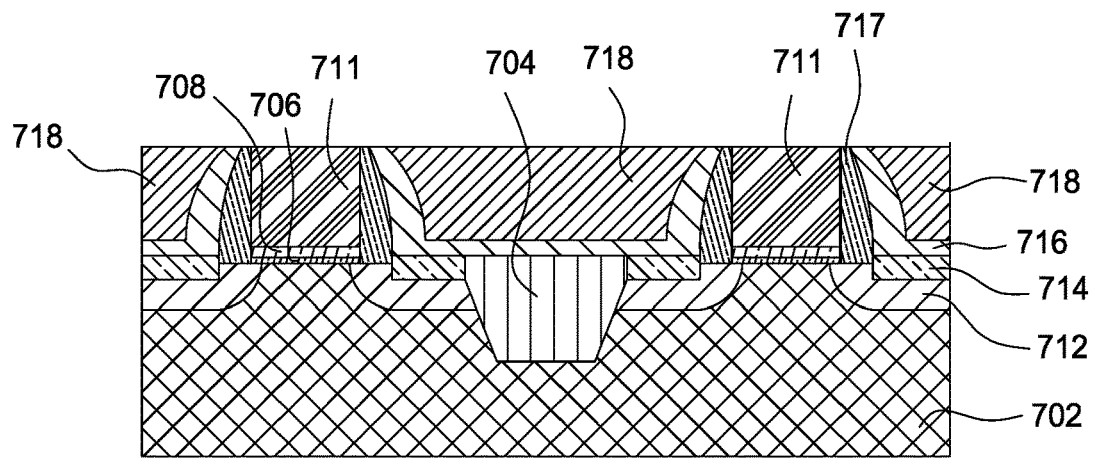

FIGS. 7A-7H depict cross-sectional views of a MOSFET, such as a CMOS transistor 700 that may be formed using embodiments of the present invention. FIGS. 7A-7H depicts a gate last approach to forming the CMOS transistor. FIG. 7A shows a CMOS transistor 700 having a substrate 702, with a shallow trench isolation (STI) 704 formed therein according to known methods. A high mobility interface layer 706 is formed on the substrate surface and over the STI 704, followed by formation of a high-k dielectric layer 708 on layer 706. A layer of polysilicon 710 is deposited on the substrate and layers 706, 708 as shown in FIG. 7B. The polysilicon 710 undergoes a photolithography process and etch to form the areas where the gate structures 711 will be formed, as shown in FIG. 7C.

Figure 7E:
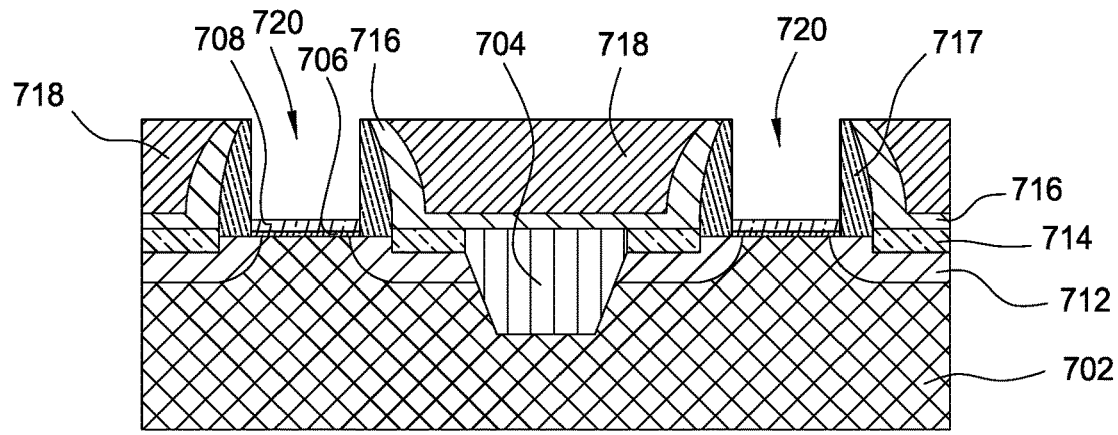
Figure 7F:
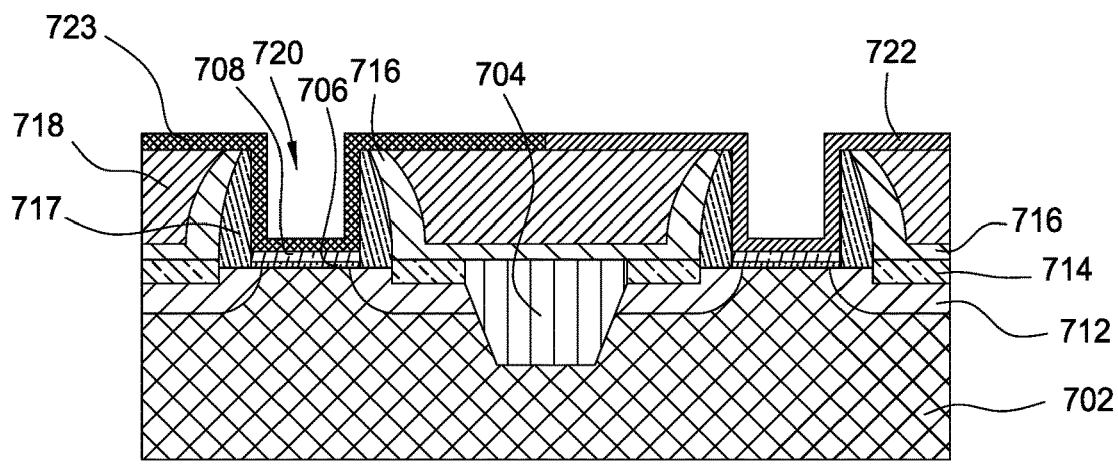
Figure 7G:
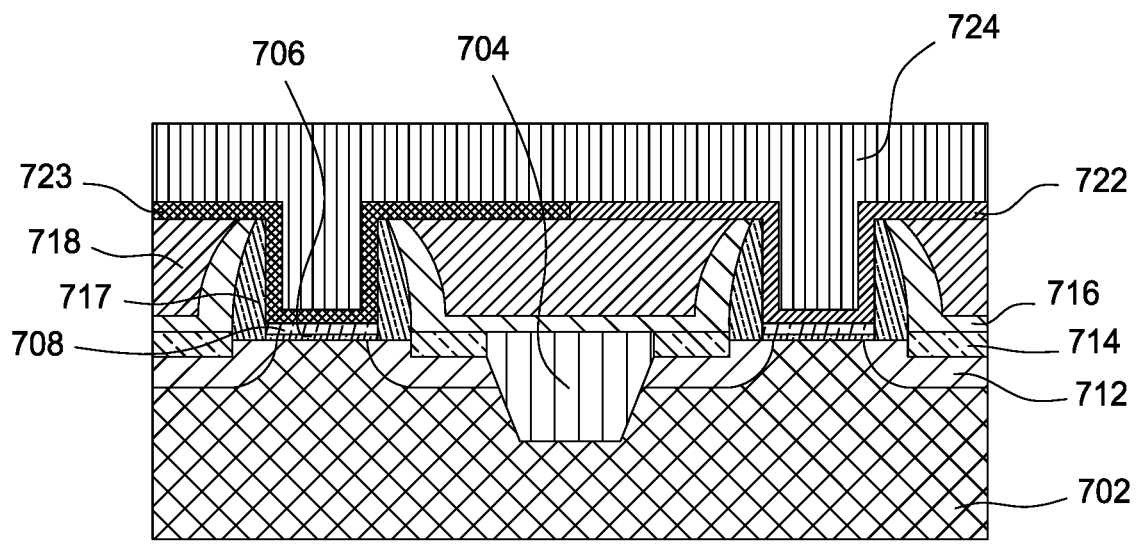
Figure 7H:
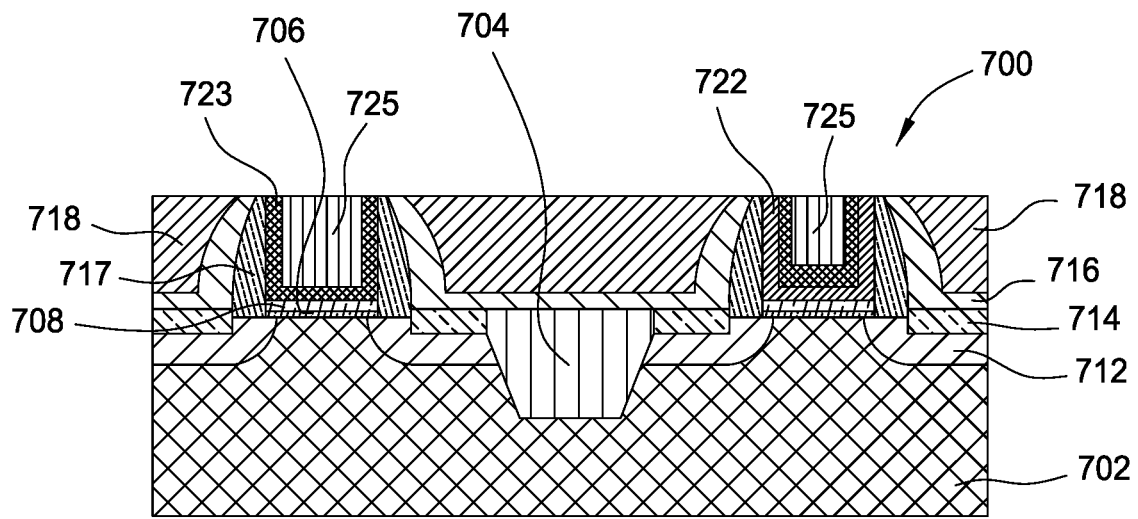

In various subsequent steps, spacers 717, salicidation 716, stress nitride layer 714, and source/drain regions 712 are formed on the substrate according to known methods in the art. A pre-metal dielectric layer 718 is formed over the remaining layers and polished to the geometry shown in FIG. 7D. The polysilicon gate structures 711 are then etched forming trenches 720, as shown in FIG. 7E. Next, doped metal gates are deposited in the trench 720, such as a p-metal gate 723 and an n-metal gate 722, as shown in FIG. 7F. The gate structures are then filled with metal 724, as shown in FIG. 7G. Lastly, the substrate is polished to form metal gates 725 on the substrate 702. Embodiments of the invention may be particularly useful in forming high-k metal gates, especially metal gates having metal alloys.

FIGS. 1A-6 depict various views of a RF-DC PVD chamber 100 according to embodiments of the invention. The RF-DC PVD chamber 100 allows a high pressure sputtering of thin metal films to form gate stacks, such as using the gate last approach described in FIGS. 7A-7H. The chamber includes an RF source with local matching network for sputtering target materials using RF energy. A magnetron helps control film uniformity, and an additional DC connection to the target enhances erosion and uniformity control.

The shape of the target may also impact the plasma distribution, thus affecting the film uniformity. Various target geometries may be used according to embodiments of the invention, such as a flat, frustum, or concave shape. Frustrum targets tend to have thicker edge and higher bump in the mid-radius. Concave targets tend to focus plasma to the center of the target and result in thicker center and less bump in the mid-radius. In one embodiment, the target may reduce trace metal contamination and uses a 6061Al alloy backing plate. In one embodiment, a multi-component target may be used in the processing chamber 100, wherein the multi-component target comprises a material having at least two different elements disposed therein. In embodiment, the multi-compositional target is TiAl alloy target that has a 1:1, a 3:1, or a 1:3 composition ratio in various embodiments of the invention. A multi-component TiAl target having a 1:1 ratio may have effective barriers to the Al fill that prevents formation of $TiAl_3$ at higher temperatures. If Ti and Al are deposited separately and excess Al is available, then $TiAl_3$ will form.

Multi-component targets provide a unique challenge for sputtering films having the desired thickness uniformity, composition uniformity, Rs uniformity, composition ratio, step coverage, bottom coverage, overhang, etc. The different components, for example, elements in a multi-component target sputter differently based on the plasma properties, mass of the elements, bonding and crystal structure of the elements in the target, as well as other variables. The bombardment of a multi-component solid surface with ions and/or neutral atoms from the neighboring plasma can alter the chemical composition of the target surface due to the difference in the sputter yield of the different constituent components of the target. FIGS. 8 and 9 further illustrate some of these issues.

FIG. 8 illustrates the elastic collision, and hence scattering, of various components having different masses, m1 and m2. Schematic 800 illustrates a particle m2 that is stationary and the affect of a collision with another particle having a mass m1, such as an Ar+ ion from a plasma. Schematic 802 illustrates a collision of two moving particles m1 and m2, and the resulting scattering of both particles due to their collision. On a much larger scale, the general scattering distribution of sputtered components within a chamber, or sputter profile, may be characterized by a cosine distribution, an under cosine distribution, or an over cosine sputtering distribution. FIG. 9 illustrates the sputtering distribution 900, or flux distribution, of elements from a multi-component target 906. For example, in one embodiment of the invention where the multi-component target 906 is a titanium-aluminum (TiAl) target, the sputtering distribution will be very different for each constituent material. Aluminum is a lighter atom (mass=27) compared to titanium (mass=48) and argon (mass=40), and thus will have a different flux distribution than titanium will have from the target surface.

It has been found that argon ions (Ar+) accelerated from the plasma to the target, will collide with the aluminum atoms and form an under cosine 902 flux distribution, or sputtering distribution. In contrast, as the Ar+ ions collide with the titanium atoms in the target 906, its sputtering distribution is characterized more closely with an over cosine distribution 904. Thus, the aluminum atoms tend to travel more horizontally than vertically compared to titanium atoms. Aluminum atoms are spread more diffusely, losing a lot more aluminum atoms to the shield rather than the substrate. However, at the center of the substrate, the Al is slightly higher because of the under cosine pressure profile. Thus, as pressure increases, the deposition rate needs to also increase because more scattering is going to the shield.

The unequal sputtering distribution of elements from a target causes non-uniform composition properties of the film sputtered on a substrate within the chamber. For example, the under cosine sputtering distribution of aluminum may lead to high amounts of aluminum on the peripheral regions of a substrate whereas the over cosine sputtering distribution of titanium may lead to high amounts of titanium in the center region of the substrate, without compensating for the unequal distribution ratios of the two constituent components in the target 906.

Increasing pressure of the chamber also effects the scattering distribution of the sputtered components. Increasing the pressure will result in more aluminum scattered due to its lower mass than titanium and its interaction with energetic ions and neutrals in the plasma. Re-sputtering may also affect the film properties and target composition during processing. Atoms from the deposited film may re-sputter from the film to another location on the substrate or even back into the processing region and onto surrounding components, such as the shield or target. At least one challenge of a multi-compositional target is to deposit a film on a substrate having a uniform compositional ratio across the surface of the substrate, and to achieve the overall desired step coverage.

Another challenge of using a multi-compositional target is the changing ratio of component materials in the target over time. The chemical composition of the target surface changes, forming a region known as the altered layer. Upon initial bombardment of the surface the constituent component with highest sputter yield is preferentially removed from the surface, enriching the surface layer in the lower sputter yield material until a steady state is reached. However, a non-steady state condition may still occur after some erosion of the target during prolonged use, leading to non-uniform composition distribution. In the example of a TiAl target, the target may shift aluminum rich because the aluminum, although easier to initially sputter from the target, may travel more horizontally and rebound from surrounding components to redeposit on the target. Whereas titanium tends to move more vertically and is heavier and thus will not be scattered as much by the components in the plasma. Thus, sputtering of multi-compositional targets may also require specific processing steps to maintain desired and/or uniform target surface composition in order to achieve a desired sputtered film composition.

The addition of DC power to a plasma also has an affect on the deposited film layer properties from a multi-compositional target. DC power coupled to the target produces a target voltage and a corresponding sheath surrounding the target surface 133. Increasing the DC power widens the sheath, accelerating the Ar+ ions more and providing more energy to the Ar+ ions, which also affects the directionality, or flux distribution, of the sputtered material from the target surface (e.g., cosine distribution). Increased DC voltage applied to the target improves the composition ratio of the film formed on the substrate surface because of more over-cosine like sputter distribution from multi-component target that is thus more directed towards the substrate. More neutral deposition occurs and ion flux increases with increased voltage, which also helps directionality of the sputtered species. The higher the voltage, the more normal to the target face (i.e. the target first surface) the ions are that enter target and the more normal to the target face the sputtering species are as they leave the target.

Increased DC target voltage sharpens, or tends to shift the flux distribution of the elements towards a more over cosine distribution, leading to less scattering of the sputtered species. Lower target voltages (e.g. 300 volts or less) tend produce a larger spread and when increasing DC and target voltage (e.g. to around 500 volts), the spread decreases and composition ratio improves, which is due at least in part to the decreased amount of scattering. As DC power is increased for a fixed RF power, the ratio is coming down and approaching one. The target potential is going higher so the sputter angle is more normal to the surface in both cases so both sputtering profiles tending towards more over cosine distribution. Also, as the DC power increases, the ion to neutral ratio in an RF plasma will become lower, so increased DC voltage will also tend to reduce the resputtering of the substrate surface due to the application of a bias to the substrate. The increased neutral flux will generally not increase the scattering of the sputtered material in the plasma.

The step coverage of a film in a feature on a substrate tends to decrease with increased DC power to the multi-component targets. Increased DC power results in higher neutral flux which means the effective ion fraction is lower. Thus, less of the sputtered material is ionized, resulting in a reduced amount of sputtered material that reaches the bottom of the feature relative to the amount deposited in the field. The neutral flux distribution can be considered essentially isotropic in energy and direction, whereas the ion flux (i.e. charged particles) to the substrate is accelerated through the substrate bias potential and there has much more directed kinetic energy which results in the improved step coverage.

Still, even significantly higher DC power only leads to perhaps 20% decrease of step coverage. So there is still a decent amount of metal ionization such that those ions are attracted to the substrate and go into the feature. Additionally, the composition ratio of aluminum to titanium of the film deposited on the substrate also decreases with increased DC power due to the increased vertical directionality of the sputtered material coming from the target.

In some cases, improved bottom coverage can be achieved by dropping the DC power because the film can be re-sputtered more due to the application of a bias to the substrate surface. However, the resputtering of the substrate surface may also be detrimental to the composition ratio, making it difficult to tune by just controlling the DC power. In some embodiments of the invention, a plasma is ignited by using a DC source 182 coupled to the multi-compositional target 132.

RF power delivered to a DC powered target may decrease the target voltage and provide a corresponding sheath surrounding and dominating the DC power induced sheath. While, an RF-DC powered target has a thicker plasma sheath formed below the target, and an overall higher voltage drop between the target and the plasma, the conductivity of the plasma will be increased due to the increased ion concentration in the plasma, which will make the target voltage drop at low to moderate RF powers. Thus, an argon ion (Ar+) is accelerated even more with a thicker sheath, providing a higher sputtering ion energy. In some cases, the peak to peak voltage created by the addition of RF power will further increase the ion energy of the plasma some. The thicker sheath will increase the scattering yield. RF power increases the ionization of the plasma which helps improve the affects of substrate bias on the depositing ions, and thus help improve step coverage of the film. Plasma ionization is also increase as RF frequency is increased, leading to increased electron movement. The sputter yield also increases as the energy level of the argon ions increase due to increased RF power. When applying RF power to DC power, the target voltage will vary with time and thus may be measured, for example, using a DC voltage sensor that provides the RMS or mean voltage value.

RF power may need to be at a minimum power to provide the ionization levels that improve sputtering and film properties, and in particular to improve step coverage of the film. The RF power setting during film deposition may be between about 1 kW and about 3.5 kW, for example, about 2 kW. In another embodiment, the RF power setting may be about 3.2 kW. Impressing an RF power on top of the DC power will change the target voltage, scattering, and sputter yield, which affects the composition ratio. In one embodiment, the target voltage may be between about 300 volts to about 550 volts, such as about 520 volts or about 400 volts. As the target voltage increases, the Al:Ti ratio decreases. A higher power creates a high power density, thus decreasing the scattering angle difference which in turned decreases the Al:Ti ratio. Also higher power increases the edge effect, and Rs uniformity becomes worse.

In light of the above, embodiments of the invention may include applying DC power from a DC power source 182 coupled to the multi-compositional target 132 when an RF plasma is formed in the processing region 110. In another embodiment of the invention, the DC power source may be set from about 450 W to about 2.5 kW and the RF power source may be set from about 1 kW to about 3.5 kW. For example, in one embodiment of the invention, the DC power source and the RF power source are both set at about 2 kW. In yet another embodiment of the invention, the DC power source is set at about 2 kW and the RF power source is set at about 3.2 kW. More specifically, in one embodiment if the target voltage is 320 volts, the RF power is at 2 kW and the DC power is at 540 W, which provides good step coverage for high aspect ratio features. In another embodiment, the target voltage is at 500 volts and both the RF and DC power is at 2 kW, which maintains a good composition ratio of the film. The target may be measured, for example, using a DC voltage sensor that provides the RMS or mean voltage value.

RF powered plasma may reach a point when argon is ionized and in turn the sputtered metal becomes more ionized which provides improved bottom coverage of substrate features due to the application of a substrate bias. As the pressure in the processing region drops, bottom coverage also drops, especially below 10 mTorr pressures. Lower pressures cause the composition to be more like a DC only powered plasma with an Al:Ti ratio near 1:1, but decrease the step coverage. So RF power in addition to high pressure helps improve bottom coverage of features in a substrate, especially features having high aspect ratios, where adequate bottom coverage can be very difficult to achieve.

Typical pressures in the processing region may be varied depending on the type of multi-component target that is used, the feature size formed on the substrate and the desired film properties. The pressure of the chamber during film deposition may be between about 20 mTorr and about 60 mTorr or even 75 mTorr, for example, about 22 mTorr, 30 mTorr, or 40 mTorr depending on desired process effects due to the chamber pressure. In one embodiment of the invention, the Ar flow rate may be from about 50 sccm to 100 sccm, for example 75 sccm. The gate valve 147 may be completely or partially open during chamber processing.

However, increasing the pressure in the processing region too much may lead to increased scattering, especially for binary films such as TiAl. As previously discussed, aluminum and titanium scatter differently off the multi-component target. The difference of the angular distribution arriving at the substrates may thus be modulated by adjusting parameters that can affect the average collision frequency after the species are sputtered from the target. Increased process pressure may also lead to higher collision frequencies, or collision times, between the sputtered species and the ions and electrons in the plasma and thus a wider difference in the angular distribution for different elements. However, higher applied power from either DC or RF sources may lead to narrow angular distribution differences by providing more forward momentum for the sputtered atoms.

Increasing the pressure in the processing region may also improve bottom coverage. However, increasing the pressure in the processing region too much can also increase scattering of the sputtered species off the target, leading to less directionality, and thus less bottom coverage. To combat this effect of increased pressure, the target voltage may be increased to decrease the effect of scattering of any binary components, which have different sputter yields and distributions, such as aluminum and titanium. Increasing the DC power also increases the deposition rate which is also helpful to combat the increased scattering effect of higher pressure on the system, however, the step coverage may drop some because the field thickness is growing faster than what is possible inside the substrate features.

Pressure thus can help change the sputtering distribution off the target to a preferred profile to help improve deposited film characteristics. The pressure also affects the re-distribution of sputtered species on the target, substrate, and the shield. Higher pressures may cause the lighter compounds, such as aluminum, to redistribute to the shield and target in particular, thus changing the target's surface compositional ratio and decreasing the amount of aluminum that reaches the substrate surface. Increased pressure provides a greater difference in scattering angle differences, which increases the Al:Ti composition ratio. Higher pressures also provide less edge effect, thus improving Rs uniformity. Pressure has a greater affect on improving Rs and thickness uniformity than DC, RF, power, or capacitive tuner position, which will be discussed in more detail below.

Pressure also affects the ionization of argon and the sputtered species passing through the plasma towards the substrate. Increased pressure and RF power applied to the plasma may also produce what is known as penning ionization. Penning ionization is a process involving reactions between neutral atoms and/or molecules. In penning ionization, the interaction between a gas-phase excited-state atom or molecule and a target molecule results in formation of a radical molecular cation, and electron, and a neutral gas molecule. For example, argon atoms may ionize other argon atoms in the plasma due to penning ionization, thereby causing RF power to more directly excite the argon plasma. The desired Argon ion energy for the process may be between about 45 eV (electron volts) and about 70 eV, such as about 50 eV. The target voltage also drops as the pressure of the processing chamber increases because the path to ground becomes more conductive. The sheath thickness drops with increased pressure which affects the target voltage and the redistribution of atoms on the target.

A magnetron may also influence film deposition and properties. The type and position of a magnetron will produce differing magnetic B-fields, which also affects the composition ratio of multi-compositional films. Aside from covering the target and eroding the target, positioning the magnetron above the multi-compositional target at certain locations also helps improve the Ti:Al ratio. Placing the magnetron in certain positions will help prevent losing so much aluminum to the shield, which normally occurs due to the diffuseness of aluminum as previously discussed. For example, the same sputtering profile will occur by placing the magnetron at the center of the target, but locally if the species spread from the center position, completely changing where the sputtered species will spread out through the chamber. In one situation, the aluminum is also diffuse, but it's not running off to the shield, but rather it is spread over the whole area of the substrate.

In a single element uniform sputtering profile type situation, depending on chamber geometries such as substrate spacing from the target and target size, the sputtering profile of the single element at any instant in time may be characterized as a single point source providing uniform coverage over the substrate as the magnetron rotates. However, with multi-compositional targets having two different profiles, uniform coverage may be difficult. But when the magnetron is in the center and the sputtering occurs mainly from the center, Rs uniformity suffers, even though the composition ratio may be improved because the sputtering source is over the center and the sputtered species spread out pretty evenly over the substrate, resulting in a relatively even distribution over the substrate.

A closed loop magnetron confines the plasma between the B-field boundaries formed by the magnetron, which will depend on the exact configuration of magnets and type of magnets used in the magnetron. An erosion track will develop in the target having a certain shape and location depending on the type of magnetron and how it's used. In a DC plasma, the magnetron confines the electrons to run around the plasma track and help ionize the plasma. Essentially, the magnetron helps confine the electrons locally so you can always supply area region where argon is ionized close to the target surface, and thus tends to build up a target erosion track in that same area. Thus, the magnetron helps control where the erosion track is formed on the target face.

An open loop magnetron creates a weaker B-field at the open end locations, resulting in a better RF power transmitted into the plasma as a whole versus a non-magnetron containing RF sputtering processing chamber. However, for RF sputtering processes in general, a magnetron is not necessary to sputter. The RF power itself allows power to be delivered from the target into the electrons, which is used to ionize the argon atoms without needing the magnetic confinement of the magnetron. Placing a closed loop magnetron closer to the target center seemed to make the process untunable with the RF power source. Thus, confining the electrons near the center portion of the target along with RF power seems to provide little to no benefit to the sputtering process.

By using an open loop magnet, a full continuous closed plasma track is not created, in other words, the electrons are trapped but only for a time, and then they can diffuse out of the magnetic field capturing region. This is because the magnetic field created between the poles of an open loop magnetron does not form a continuous closed-loop path when looking along a 2-D plane parallel to the target surface. In other words, tracing a path that follows portions of the formed magnetic field where the magnetic field vector is parallel to the target face (i.e., $B_z=0$; where the z-direction is normal to the target face) along a 2-D plane that is parallel to the target surface, the path does not form a continuous closed loop. The film composition may depend strongly on the relative locations between the plasma erosion track and the substrate position. The magnetron position will modulate the plasma erosion track and adjust the film composition. For example, the magnetron position may be in a first position, forming a plasma near an outer region of the target as depicted in FIG. 4D. The deposited film composition on the substrate may approach 1 when the magnetron is in the first position, accounting for the differing distribution profiles of the constituent elements of the target. The magnetron may be spaced above the target from between about 2.2 mm to 2.8 mm, such as 2.5 mm. The magnetron may rotate at between about 60 to about 70 rpm, such as 65 rpm.

A DC only plasma with a magnetron traps the electrons in generally a more defined region. Adding RF power essentially tunes the electrons and the argon so that the plasma is much more highly energized even though they're confined to a smaller area. The open loop magnetron permits the electrons to escape by only partially confining them in the plasma area under the magnetron. The open loop magnetron may allow sputtering of a larger portion of the target surface. Thus, the magnetic field between the inner and outer pole are open on one end, and electrons will leak out of the magnetic field associated with either end of the poles. It has been found that, placing the magnetron in the "out" position can improve the composition ratio of the Al and Ti on the substrate surface, due to the affect of the varying sputtering distributions of the multi-component target elements. Additionally, moving the magnetron to a center region or "in" position may be used to clean the chamber such as redeposited sputter material on the target, which will be discussed in greater detail below with reference to FIGS. 10A-10C.

Deposited film properties may also be affected by the substrate bias. An automatically adjusted variable capacitive tuner may be used to provide a bias to the substrate support as described above. Adjusting the capacitance of the capacitive tuner will vary the bias voltage on the substrate support. Different positions of the capacitive tuner may be used to deposit and/or resputter the deposited film. In some cases, the substrate bias is used in an "etch mode" that incurs no net deposition, to modulate stress in a film formed on the surface of the substrate. The sputtered metal atoms have different masses and thus by adjusting the bias voltage on the substrate one can change the deposited film composition one way or another, by adjusting the ion bombardment and resputtering of the deposited film. For example, since aluminum and titanium have different sputter yields, varying the bias voltage can be used to change how energetic the bombardment is, which will alter the composition ratio of the deposited film.

In one example, the higher the positive voltage on the substrate, the more titanium rich will be the deposition, since the larger, heavier titanium atom is not as easily redirected as aluminum. Thus, under positive substrate bias voltage, the more neutral containing titanium atoms in the plasma tend to make it to the surface of the substrate. Whereas, aluminum is lighter and more easily ionized, and will not reach the substrate surface due to the positive bias voltage with same degree as titanium, leading to a titanium rich film. On the other side of the spectrum, at high negative substrate bias voltages, aluminum will move around more than titanium because it more easily resputters by the arriving ions pulled from the plasma by the application of the substrate bias. The negative voltage affects the energy of the ions that strike the substrate surface, which will move aluminum atoms around more, also yielding a titanium rich surface. And since one material preferentially resputters at a different rate versus another, setting the substrate bias voltage effectively controls the amount of resputtering, and thus the composition ratio as well. Thus, a middle substrate bias voltage that is not too positive or too negative is necessary to achieve substantially uniform composition ratios of the deposited film on the substrate.

As the capacitance of the variable capacitor in the impedance controller 141 increases, the Al:Ti ratio decreases, approaching 1, for example 1.2, and even less than 1 in some conditions, such as 0.90. In one embodiment, the Al:Ti ratio is between about 0.9 to about 1.2, such as 1.0 and 1.1. The average composition ratio from center to edge may be between about 1.15 to about 1.16. Aluminum is easier to sputter away by Ar+ ions when the bias voltage becomes negative. When the bias voltage is positive, the Al and Ti ions are pushed away from the substrate. The Al:Ti ratio however increases because the Ti ion fraction is lower than the Al ion fraction in the plasma. The resonance setting of the circuit in the impedance controller 141 also affects bias voltage. As the bias voltage approaches the resonance, the Al:Ti ratio decreases, due to the near maximum negative substrate bias voltage achieved at the substrate. In one embodiment the voltage bias on the substrate may be from +250 to −250 $V_{dc}$. In another embodiment, the voltage bias on the substrata is between about −150 volts to +50 volts.

As shown in FIG. 6, one embodiment of the invention includes adjusting a bias voltage on an electrode 126A disposed in the substrate support 126 that has a substrate receiving surface 127 disposed in the processing region 110, wherein the bias voltage is adjusted by changing the capacitance of a variable capacitor 610 to control the bias voltage achieved at the electrode 126A relative to an electrical ground. The capacitance of the variable capacitor 610 is varied between 5 and 1,000 picofarads. For example, the variable capacitor may be set at 12.5% of total capacity or as high as 85% of total capacity. The resonance of the system may be at around 55% total capacity.

Thus, by using the various parameters discussed above, various methods may be used to improve step-coverage and film uniformity when using the above apparatuses. In one embodiment of the invention, a high pressure, RF power, and DC power are used in a RF-DC PVD chamber to deposit a metal film in a gate structure.

Figure 11:
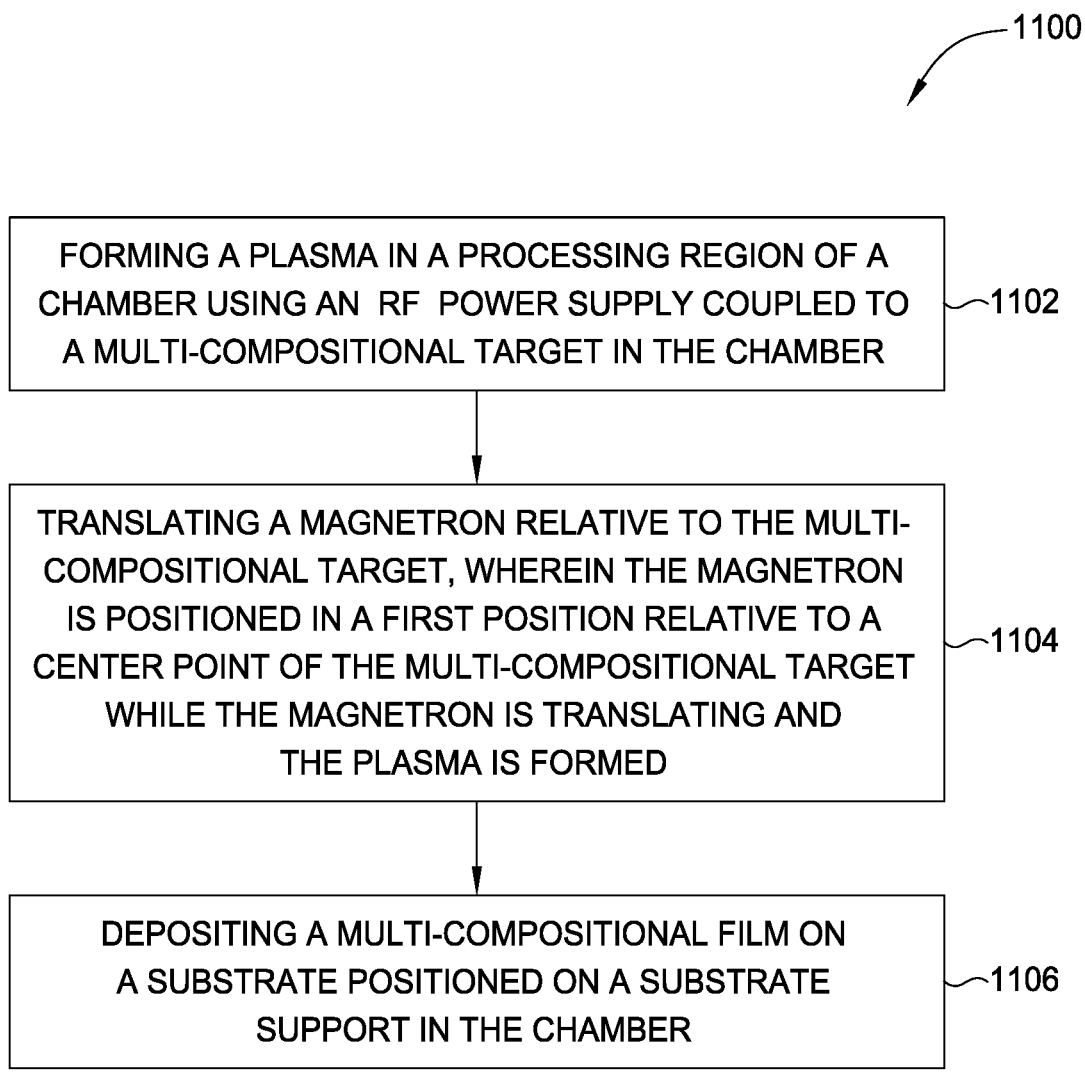
FIG. 11 illustrates a process diagram of the method of depositing a film according to one embodiment of the invention.

FIG. 11 depicts a process flow of a method 1100 of depositing a thin film according to various embodiments of the invention. At 1102, the method includes forming a plasma in a processing region 110 of a chamber 100 as shown in FIG. 1A. The plasma is formed by using an RF power supply 181 coupled to a multi-compositional target 132 in the chamber 100, the multi-compositional target 132 has a first surface, such as sputtering surface 133, that is in contact with the processing region 110 of the chamber 100 and a second surface 135 that is opposite the first surface 133. At 1104, the method includes translating a magnetron system 189 relative to the multi-compositional target 132, wherein the magnetron system 189 is positioned in a first position, such as depicted in FIG. 4D, relative to a center point of the multi-compositional target 132 while the magnetron system is translating and the plasma P is formed. At 1106, a multi-compositional film is deposited on a substrate 105 positioned on a substrate support 126 in the chamber. The multi-compositional film may be a metal alloy, such as a TiAl alloy, deposited in a metal gate 725, as depicted in FIGS. 7A-7H. The multi-compositional film is deposited at 120 Å per minute and is about 100 Å thick. In one embodiment, the film thickness may be between about 40 Å and about 150 Å with deposition rates from about 30 Å/min. to 240 Å/min. However, the desired thickness is governed by the work function requirement and a person of ordinary skill could adjust that accordingly. Embodiments of the invention may be able to process more than 20 substrates an hour.

In another embodiment of the invention, the magnetron system 189 is disposed adjacent the second surface 135 of the multi-compositional target 132 while the magnetron system 189 is translated by rotating the magnetron system 189 about the center point of the multi-compositional target as illustrated in FIGS. 4B-4D. As discussed previously, the magnetron system may include an outer pole 421 comprising a plurality of magnets 423 and an inner pole 422 comprising a plurality of magnets 423, wherein the outer and inner poles form an open-loop magnetron assembly. In another embodiment, the method includes varying a bias voltage on a substrate by adjusting a capacitance of a variable capacitor 610 that is coupled between an electrode 126A disposed in the substrate support 126 and an electrical ground.

The method also includes positioning a cover ring 170 a distance from an peripheral edge 129 of a substrate receiving surface 127 of the substrate support 126, wherein a surface of the cover ring that is exposed to the formed plasma is also disposed a distance farther away from the multi-compositional target 132 than the substrate receiving surface 127, and the cover ring 170 is not in electrical communication with the electrical ground when the plasma is formed in the processing region. In another embodiment, the spacing between the multi-compositional target 132 and the substrate 105 may be between 174 to 182 mm. As you move farther away from the target, the more under cosine sputtered material will hit the shield at a greater rate. So spacing will also affect the scattering. Additionally, increased spacing moves the substrate away from the plasma.

In another embodiment, the magnetron system may include an outer pole 424 and an inner pole 425 that are concentric about a first axis 491 that extends through a center point and form a closed-loop magnetron assembly such as illustrated in FIG. 4E. The plurality of magnets 423 are disposed in the inner and outer poles 425, 424 and are not symmetric about a second axis 492 that extends through the center point and is perpendicular to the first axis 491. In the embodiments of the invention, the step coverage may be as high as 80% in high aspect ratio features on a substrate. In some embodiment, the step coverage may be even 100%.

In another embodiment, a method of depositing a thin film includes delivering energy to a plasma formed in a processing region of a chamber, wherein delivering energy comprises delivering RF power from an RF power supply to a multi-compositional target and delivering DC power from a DC power supply to the multi-compositional target. Delivering DC power means to apply a DC energy from a DC power supply, such as a DC voltage or current to the multi-component target. Delivering RF power means to apply an RF energy from an RT power supply to the multi-component target.

The method also includes translating a magnetron relative to the multi-compositional target, wherein the magnetron is positioned in a first position relative to a center point of the multi-compositional target while the magnetron is translating and the plasma is formed; adjusting a bias voltage on an electrode disposed near a substrate receiving surface of a substrate support, wherein the bias voltage is adjusted by changing the capacitance of a variable capacitor to control the bias voltage achieved at the electrode relative to an electrical ground; pressurizing the processing region to at least 20 mTorr; and depositing a metal alloy film on a substrate disposed on the substrate receiving surface.

In another embodiment of the invention, a pre-deposition burn-in of the target is performed to get the preferred altered layer on the target before beginning film deposition. Target burn in removes contaminants remaining from the target manufacturing process, adsorbed gases from the target, and conditions the process kit to be ready for TiAl film deposition. Target burn in can also begin formation of the "race track" or erosion grooves in the target.

Figure 10C:
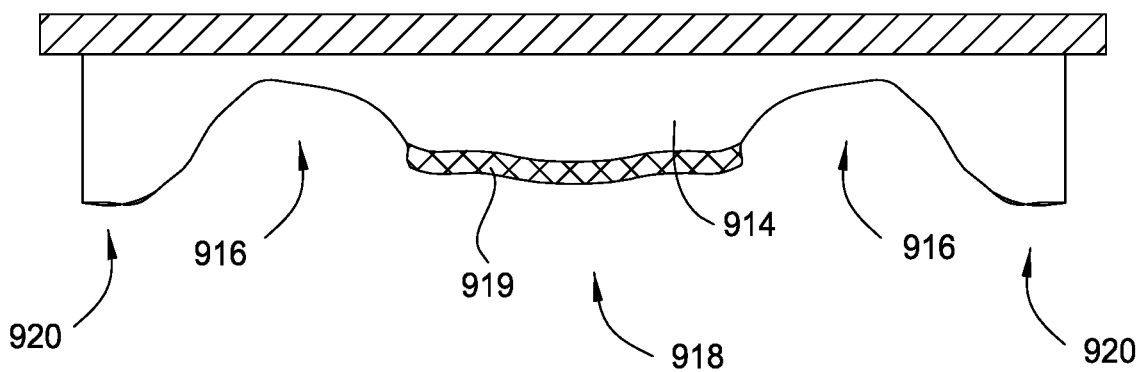

After processing a batch of substrates, the chamber may need to be cleaned and the target reconditioned in particular. As previously discussed, the constituent elements from the multi-compositional target may redeposit on the target. Aluminum is particularly susceptible to redeposit on the target center area because of its light mass and the scattering effects of the process. FIGS. 10A-10C depict a target during various stages of use. FIG. 10A illustrates a new target assembly 910 having a backing plate 912 and a multi-component target 914, for example comprising a TiAl alloy having a 1:1 ratio. After burn-in and during the film deposition process, the race track or erosion grooves 916 begin to form in the target. As the magnetron is rotating in the "out" position during sputtering, the plasma forms underneath the magnetron along an outer region of the target.

The center region 918 also experiences some erosion but not as much since the plasma is denser under the target in the outer region where the magnetron is located. Over processing time however, constituent material may be redeposited on the target forming a redeposit region 919 having a different composition than the rest of the target, as shown in FIG. 10C. One batch may be from 25 to 50 substrates, and the degree to which the redeposit region 919 forms and necessitates cleaning prior to further film deposition will depend on the various processing settings.

A post-deposition cleaning process may be performed after processing a batch of substrates. The cleaning process may comprise a first process and a second process. The first process may include removing the substrate from the chamber and moving the source magnetron assembly 420 to a second position. In one example, the position of the source magnetron assembly 420 is adjusted by changing the rotation direction of the magnetron translation device (e.g., motor 193). The second position is the "in" position as shown in FIG. 4C. A plasma P is then ignited using RF and DC power coupled to the multi-component target 132 and a plasma is formed under an inner portion of the first surface of the multi-compositional target. The chamber is pressurized to 2 mTorr. The re-deposited material 919, which was built up on the center region 918 of the target, is subsequently removed. Both the DC power and RF power are set at 2 kW during the first process. The variable capacitor may be set at 12.5%. The plasma may remain on to clean the chamber for as long as 45 seconds. Portions of the first process, such as the plasma ignition/formation and removal, may be repeated as many as 7 times to remove the redeposit from the center of the target.

The second process includes moving the magnetron assembly to the first position or "out" position as shown in FIG. 4D. A plasma is ignited using RF and DC power coupled to the multi-component target and a plasma formed under an outer portion of the first surface of the multi-compositional target. The chamber is pressurized to 40 mTorr and the erosion grooves 916 are re-formed in the multi-compositional target to look similar to FIG. 10B.

In the high pressure range of embodiments of the invention, the RF power excites the plasma ions, such as Ar, and the elevated pressure and Ar ion collisions increase the ion fraction. Heavier gases such as krypton (Kr) or xenon (Xe) may produce more effective scattering so that the horizontal velocity of the ions may be reduced. This is especially useful for heavier metal deposition such as tantalum (Ta), tungsten (W), etc. Embodiments of the invention provide the ability to achieve high film uniformities and step-coverage.

According to embodiments of the invention, the RF power applied to the target and high pressure generates a high density plasma near the target. When the sputtered species pass through the plasma, they get ionized, which significantly increases the ion/neutral ratio of the plasma. Additionally, when the sputtered species go to the substrate in a high pressure ambient, many collisions happen which help reduce the energy of species parallel to the substrate direction and increases its vertical directionality. Since the atoms get ionized near the target and not near the substrate surface (as the plasma is constrained by the asymmetric B-field from the magnetron) the velocity of the ions are not as vertical as other types of methods, such as ionized metal plasma (IMP), providing better sidewall/step coverage.

Using RF-DC power sources coupled to the multi-component target provides asymmetry and imbalance which allows the electrons to move radially toward the target center and plasma center thus helping to increase the ionization and target utilization.

Improved step-coverage of this process may occur because of the following reasons. A high density plasma forms under the target, so that metal species get ionized when they pass through the plasma. High pressure and high RF power increases the RF plasma density, meaning increased density of electrons and Ar+. High pressure also reduces the mean free path so that metal species are more easily hit by electrons or Ar+, and get ionized. Additionally, the sputtered metal has a lower horizontal velocity near the substrate surface so that the metal ion can be easily pulled down to the substrate. The low velocity of metal species is achieved by losing its original velocity along the horizontal direction through multiple random scattering with Ar+ which is further enhanced by high pressure. Thus, according to embodiments of the invention, uniform film composition from multi-component targets having good step coverage, uniform thickness, desired constituent ratios, and Rs values may be formed.

While the foregoing is directed to embodiments of the present invention, other and further embodiments of the invention may be devised without departing from the basic scope thereof, and the scope thereof is determined by the claims that follow.

The invention claimed is:

1. A plasma processing chamber, comprising:
a lid assembly, comprising:
a target having a first surface that is in contact with a processing region and a second surface that is opposite the first surface; and
a lid enclosure, comprising:
a center feed that is electrically coupled to the target by a conductive wall;
the conductive wall directly coupled to the center feed at a first end of the center feed; and
the center feed including a flange at a second end of the center feed, the first end and the second end being opposing ends of the center feed, wherein
the center feed is hollow throughout,
the center feed has a length (A),
the center feed has a thickness defined by a difference between an outer diameter ($D_1$) and an inner diameter ($D_2$),
a surface area aspect ratio of the center feed is between about 0.001/mm and about 0.025/mm, wherein the surface area aspect ratio is calculated by $A/(\pi D_1 A + \pi D_2 A)$,
the flange is directly coupled to a radio frequency (RF) power supply, and
the flange is directly coupled to a direct current (DC) power supply.

2. The plasma processing chamber of claim 1, further comprising a magnetron disposed adjacent to the second surface of the target, wherein the magnetron comprises:
an outer pole comprising a first plurality of magnets; and
an inner pole comprising a second plurality of magnets.

3. The plasma processing chamber of claim 1, wherein the center feed is positioned over a central axis of the target.

4. The plasma processing chamber of claim 1, further comprising:
a grounded shield;
a cover ring; and
a deposition ring disposed over a portion of a substrate support, wherein during processing the cover ring is disposed on a portion of the deposition ring, and the deposition ring and the cover ring are disposed below a substrate receiving surface of the substrate support.

5. The plasma processing chamber of claim 4, further comprising:
a variable capacitor; and
a controller that is adapted to adjust an amount of capacitance of the variable capacitor during processing.

6. The plasma processing chamber of claim 1, further comprising:
a cover ring disposed below a substrate receiving surface of a substrate support; and
a motor having a shaft that has a rotation axis.

7. The plasma processing chamber of claim 6, further comprising:
a magnetron disposed adjacent to the second surface of the target, wherein the magnetron comprises:
a cross arm that is coupled to the shaft;
a plate coupled to the cross arm at a pivot point, wherein the pivot point is a distance from the rotation axis; and
an outer pole and an inner pole that are coupled to the plate.

8. The plasma processing chamber of claim 7, wherein a center of mass of the plate is configured to move a first distance from the rotation axis when rotated in a first direction, and the center of mass of the plate is configured to move a second distance from the rotation axis when rotated in a second direction.

9. The plasma processing chamber of claim 7, wherein a center of mass of the plate is configured to rotate about the pivot point in a third direction when the shaft is rotated in a first direction, and the center of mass of the plate is configured to rotate in a fourth direction about a pivot axis when the shaft is rotated in a second direction that is opposite to the first direction.

10. The plasma processing chamber of claim 7, wherein the outer pole and the inner pole form a portion of an arc.

11. A plasma processing chamber, comprising:
a lid assembly, comprising:
a target having a first surface that is in contact with a processing region and a second surface that is opposite the first surface;
a grounded shield; and
a lid enclosure, comprising:
a center feed that is electrically coupled to the target by a conductive wall;
the conductive wall directly coupled to the center feed at a first end of the center feed; and
the center feed including a flange at a second end of the center feed, the first end and the second end being opposing ends of the center feed, wherein
the center feed is hollow throughout,
the center feed has a length (A),
the center feed has a thickness defined by a difference between an outer diameter ($D_1$) and an inner diameter ($D_2$),
a surface area aspect ratio of the center feed is between about 0.001/mm and about 0.025/mm, wherein the surface area aspect ratio is calculated by $A/(\pi D_1 A + \pi D_2 A)$,
the flange is directly coupled to a radio frequency (RF) power supply, and
the flange is directly coupled to a direct current (DC) power supply.

12. The plasma processing chamber of claim 11, further comprising a magnetron disposed adjacent to the second surface of the target, wherein the magnetron comprises:
an outer pole comprising a first plurality of magnets; and
an inner pole comprising a second plurality of magnets.

13. The plasma processing chamber of claim 11, further comprising:
a cover ring disposed below a substrate receiving surface of a substrate support.

14. The plasma processing chamber of claim 11, further comprising:
an open-loop magnetron comprising an outer pole and an inner pole, wherein the inner pole is separated from the outer pole by a gap.

15. The plasma processing chamber of claim 14, wherein the open-loop magnetron further comprises a rotation plate adapted to support the outer pole and the inner pole.

16. The plasma processing chamber of claim 14, wherein the inner pole comprises a first plurality of magnets and the outer pole comprises a second plurality of magnets.

17. The plasma processing chamber of claim 11, wherein the target has a frustum or concave shape.

18. A plasma processing chamber, comprising:
   a lid assembly, comprising:
      a target having a first surface that is in contact with a processing region and a second surface that is opposite the first surface; and
   a lid enclosure, comprising:
      a center feed that is electrically coupled to the target by a conductive wall;
      the conductive wall directly coupled to the center feed at a first end of the center feed; and
      the center feed including a flange at a second end of the center feed, the first end and the second end being opposing ends of the center feed, and
      a dielectric layer disposed over the flange, wherein the center feed is hollow throughout,
      the center feed has a length (A),
      the center feed has a thickness defined by a difference between an outer diameter ($D_1$) and an inner diameter ($D_2$),
      a surface area aspect ratio of the center feed is between about 0.001/mm and about 0.025/mm, wherein the surface area aspect ratio is calculated by $A/(\pi D_1 A + \pi D_2 A)$,
      the flange is directly coupled to a radio frequency (RF) power supply, and
      the flange is directly coupled to a direct current (DC) power supply.

19. The plasma processing chamber of claim 18, further comprising a magnetron disposed adjacent to the second surface of the target, wherein the magnetron comprises:
   an outer pole comprising a first plurality of magnets; and
   an inner pole comprising a second plurality of magnets.

* * * * *